(12) United States Patent
Ahn et al.

(10) Patent No.: US 7,081,421 B2
(45) Date of Patent: Jul. 25, 2006

(54) LANTHANIDE OXIDE DIELECTRIC LAYER

(75) Inventors: Kie Y. Ahn, Chappaqua, NY (US);
Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/926,812

(22) Filed: Aug. 26, 2004

(65) Prior Publication Data

US 2006/0046505 A1    Mar. 2, 2006

(51) Int. Cl.
*H01L 21/44*   (2006.01)
*H01L 21/31*   (2006.01)

(52) U.S. Cl. ............ 438/785; 438/686; 427/96.1; 427/96.8

(58) Field of Classification Search .......... 438/785, 438/686; 427/96.1, 96.8
See application file for complete search history.

(56) References Cited

U.S. PATENT DOCUMENTS

| | | | |
|---|---|---|---|
| 3,488,633 A | 1/1970 | King et al. | |
| 4,058,430 A | 11/1977 | Suntola et al. | |
| 4,413,022 A | 11/1983 | Suntola et al. | |
| 5,049,516 A | 9/1991 | Arima | |
| 5,055,319 A | 10/1991 | Bunshah et al. | |
| 5,426,603 A | 6/1995 | Nakamura et al. | |
| 5,496,597 A | 3/1996 | Soininen et al. | |
| 5,562,952 A | 10/1996 | Nakahigashi et al. | |
| 5,572,052 A | 11/1996 | Kashihara et al. | |
| 5,674,563 A | 10/1997 | Tarui et al. | |
| 5,698,022 A | 12/1997 | Glassman et al. | |
| 5,751,021 A | 5/1998 | Teraguchi | |
| 5,801,105 A | 9/1998 | Yano et al. | |
| 5,810,923 A | 9/1998 | Yano et al. | |
| 5,827,571 A | 10/1998 | Lee et al. | |
| 5,828,080 A | 10/1998 | Yano et al. | |
| 5,840,897 A | 11/1998 | Kirlin et al. | |
| 5,916,365 A | 6/1999 | Sherman | |
| 5,981,350 A | 11/1999 | Geusic et al. | |
| 6,010,969 A | 1/2000 | Vaartstra | |
| 6,020,024 A | 2/2000 | Maiti et al. | |
| 6,025,225 A | 2/2000 | Forbes et al. | |

(Continued)

FOREIGN PATENT DOCUMENTS

EP    1096042    5/2001

(Continued)

OTHER PUBLICATIONS

Chin, A. , et al., "High Quality La2O3 and Al2O3 Gate Dielectrics with Equivalent Oxide Thickness 5-10Å", *Digest of Technical Papers, 2000 Symposium on VLSI Technology*, 2000, Honolulu, (Jun. 13-15, 2000), 16-17.

(Continued)

*Primary Examiner*—Alexander Ghyka
(74) *Attorney, Agent, or Firm*—Schwegman, Lundberg, Woessner & Kluth, P.A.

(57) ABSTRACT

A ruthenium gate for a lanthanide oxide dielectric layer and a method of fabricating such a combination gate and dielectric layer produce a reliable structure for use in a variety of electronic devices. The lanthanide oxide dielectric layer is formed by depositing lanthanum by atomic layer deposition onto a substrate surface using a trisethylcyclopentadionato-lanthanum precursor or a trisdipyvaloylmethanatolan-thanum precursor. A ruthenium or a conductive ruthenium oxide gate may be formed on the lanthanide oxide dielectric layer. A ruthenium gate on a lanthanide oxide dielectric layer provides a gate structure that effectively prevents a reaction between the gate and the lanthanide oxide dielectric layer.

45 Claims, 5 Drawing Sheets

FORM A DIELECTRIC LAYER CONTAINING A LANTHANIDE OXIDE LAYER IN AN INTEGRATED CIRCUIT INCLUDING FORMING THE LANTHANIDE OXIDE LAYER BY ATOMIC LAYER DEPOSITION USING A TRISETHYLCYCLROPENTADIENATOLANTHANUM PRECURSOR — 210

DEPOSIT A CONDUCTIVE LAYER CONTAINING RUTHENIUM, THE CONDUCTIVE LAYER CONTACTING THE DIELECTRIC LAYER — 220

U.S. PATENT DOCUMENTS

| | | |
|---|---|---|
| 6,027,961 A | 2/2000 | Maiti et al. |
| 6,059,885 A | 5/2000 | Ohashi et al. |
| 6,090,636 A | 7/2000 | Geusic et al. |
| 6,110,529 A | 8/2000 | Gardiner et al. |
| 6,134,175 A | 10/2000 | Forbes et al. |
| 6,150,188 A | 11/2000 | Geusic et al. |
| 6,191,448 B1 | 2/2001 | Forbes et al. |
| 6,198,168 B1 | 3/2001 | Geusic et al. |
| 6,200,893 B1 | 3/2001 | Sneh |
| 6,203,613 B1 | 3/2001 | Gates et al. |
| 6,207,589 B1 | 3/2001 | Ma et al. |
| 6,211,035 B1 | 4/2001 | Moise et al. |
| 6,217,645 B1 | 4/2001 | Vaartstra |
| 6,225,237 B1 | 5/2001 | Vaartstra |
| 6,273,951 B1 | 8/2001 | Vaartstra |
| 6,297,539 B1 | 10/2001 | Ma et al. |
| 6,313,035 B1 | 11/2001 | Sandhu et al. |
| 6,317,357 B1 | 11/2001 | Forbes |
| 6,323,081 B1 | 11/2001 | Marsh |
| 6,323,511 B1 | 11/2001 | Marsh |
| 6,329,286 B1 | 12/2001 | Vaartstra |
| 6,342,445 B1 | 1/2002 | Marsh |
| 6,368,398 B1 | 4/2002 | Vaartstra |
| 6,380,579 B1 | 4/2002 | Nam et al. |
| 6,381,168 B1 | 4/2002 | Forbes |
| 6,387,712 B1 | 5/2002 | Yano et al. |
| 6,395,650 B1 | 5/2002 | Callegari et al. |
| 6,399,979 B1 | 6/2002 | Noble et al. |
| 6,403,414 B1 | 6/2002 | Marsh |
| 6,404,027 B1 | 6/2002 | Hong et al. |
| 6,418,050 B1 | 7/2002 | Forbes |
| 6,420,279 B1 | 7/2002 | Ono et al. |
| 6,426,292 B1 | 7/2002 | Vaartstra |
| 6,429,065 B1 | 8/2002 | Forbes |
| 6,434,041 B1 | 8/2002 | Forbes |
| 6,441,417 B1 | 8/2002 | Zhang et al. |
| 6,444,592 B1 | 9/2002 | Ballantine et al. |
| 6,451,641 B1 | 9/2002 | Halliyal et al. |
| 6,451,695 B1 | 9/2002 | Sneh |
| 6,452,229 B1 | 9/2002 | Krivokapic |
| 6,454,912 B1 | 9/2002 | Ahn et al. |
| 6,455,717 B1 | 9/2002 | Vaartstra |
| 6,458,701 B1 | 10/2002 | Chae et al. |
| 6,465,298 B1 | 10/2002 | Forbes et al. |
| 6,465,334 B1 | 10/2002 | Buynoski et al. |
| 6,476,434 B1 | 11/2002 | Noble et al. |
| 6,482,740 B1 | 11/2002 | Soininen et al. |
| 6,486,027 B1 | 11/2002 | Noble et al. |
| 6,486,703 B1 | 11/2002 | Noble et al. |
| 6,492,233 B1 | 12/2002 | Forbes et al. |
| 6,495,436 B1 | 12/2002 | Ahn et al. |
| 6,495,458 B1 | 12/2002 | Marsh |
| 6,498,065 B1 | 12/2002 | Forbes et al. |
| 6,504,214 B1 | 1/2003 | Yu et al. |
| 6,506,666 B1 | 1/2003 | Marsh |
| 6,509,234 B1 | 1/2003 | Krivokapic |
| 6,509,280 B1 | 1/2003 | Choi |
| 6,514,828 B1 | 2/2003 | Ahn et al. |
| 6,515,510 B1 | 2/2003 | Noble et al. |
| 6,518,615 B1 | 2/2003 | Geusic et al. |
| 6,526,191 B1 | 2/2003 | Geusic et al. |
| 6,527,866 B1 | 3/2003 | Matijasevic et al. |
| 6,528,858 B1 | 3/2003 | Yu et al. |
| 6,531,324 B1 | 3/2003 | Hsu et al. |
| 6,531,354 B1 | 3/2003 | Maria et al. |
| 6,534,357 B1 | 3/2003 | Basceri |
| 6,534,420 B1 | 3/2003 | Ahn et al. |
| 6,537,613 B1 | 3/2003 | Senzaki et al. |
| 6,538,330 B1 | 3/2003 | Forbes |
| 6,541,079 B1 | 4/2003 | Bojarczuk, Jr. et al. |
| 6,551,929 B1 | 4/2003 | Kori et al. |
| 6,555,879 B1 | 4/2003 | Krivokapic et al. |
| 6,586,792 B1 | 7/2003 | Ahn et al. |
| 6,590,252 B1 | 7/2003 | Kutsunai et al. |
| 6,596,583 B1 | 7/2003 | Agarwal et al. |
| 6,597,037 B1 | 7/2003 | Forbes et al. |
| 6,602,720 B1 | 8/2003 | Hsu et al. |
| 6,608,378 B1 | 8/2003 | Ahn et al. |
| 6,613,656 B1 | 9/2003 | Li |
| 6,617,634 B1 | 9/2003 | Marsh et al. |
| 6,632,279 B1 | 10/2003 | Ritala et al. |
| 6,638,859 B1 | 10/2003 | Sneh et al. |
| 6,642,567 B1 | 11/2003 | Marsh |
| 6,645,882 B1 | 11/2003 | Halliyal et al. |
| 6,646,307 B1 | 11/2003 | Yu et al. |
| 6,652,924 B1 | 11/2003 | Sherman |
| 6,653,209 B1 | 11/2003 | Yamagata |
| 6,660,631 B1 | 12/2003 | Marsh |
| 6,660,660 B1 | 12/2003 | Haukka et al. |
| 6,661,058 B1 | 12/2003 | Ahn et al. |
| 6,682,602 B1 | 1/2004 | Vaartstra |
| 6,686,212 B1 | 2/2004 | Conley, Jr. et al. |
| 6,689,660 B1 | 2/2004 | Noble et al. |
| 6,690,055 B1 | 2/2004 | Uhlenbrock et al. |
| 6,699,747 B1 | 3/2004 | Ruff et al. |
| 6,709,978 B1 | 3/2004 | Geusic et al. |
| 6,709,989 B1 | 3/2004 | Ramdani et al. |
| 6,713,846 B1 | 3/2004 | Senzaki |
| 6,723,577 B1 | 4/2004 | Geusic et al. |
| 6,730,575 B1 | 5/2004 | Eldridge |
| 6,754,108 B1 | 6/2004 | Forbes |
| 6,756,298 B1 | 6/2004 | Ahn et al. |
| 6,764,901 B1 | 7/2004 | Noble |
| 6,767,582 B1 | 7/2004 | Elers |
| 6,767,795 B1 | 7/2004 | Ahn et al. |
| 6,768,175 B1 | 7/2004 | Morishita et al. |
| 6,770,536 B1 | 8/2004 | Wilk et al. |
| 6,777,715 B1 | 8/2004 | Geusic et al. |
| 6,778,441 B1 | 8/2004 | Forbes et al. |
| 6,780,704 B1 | 8/2004 | Raaijmakers et al. |
| 6,787,370 B1 | 9/2004 | Forbes |
| 6,787,413 B1 | 9/2004 | Ahn |
| 6,790,791 B1 | 9/2004 | Ahn et al. |
| 6,803,311 B1 | 10/2004 | Choi |
| 6,804,136 B1 | 10/2004 | Forbes |
| 6,812,100 B1 | 11/2004 | Ahn et al. |
| 6,812,513 B1 | 11/2004 | Geusic et al. |
| 6,812,516 B1 | 11/2004 | Noble et al. |
| 6,818,937 B1 | 11/2004 | Noble et al. |
| 6,831,315 B1 | 12/2004 | Raaijmakers et al. |
| 6,844,203 B1 | 1/2005 | Ahn et al. |
| 6,844,260 B1 | 1/2005 | Sarigiannis et al. |
| 6,852,167 B1 | 2/2005 | Ahn |
| 6,858,120 B1 | 2/2005 | Ahn et al. |
| 6,858,444 B1 | 2/2005 | Ahn et al. |
| 6,884,739 B1 | 4/2005 | Ahn et al. |
| 6,888,739 B1 | 5/2005 | Forbes |
| 6,893,984 B1 | 5/2005 | Ahn et al. |
| 6,900,122 B1 | 5/2005 | Ahn et al. |
| 6,914,800 B1 | 7/2005 | Ahn et al. |
| 6,919,266 B1 | 7/2005 | Ahn et al. |
| 6,921,702 B1 | 7/2005 | Ahn et al. |
| 6,952,032 B1 | 10/2005 | Forbes et al. |
| 6,958,302 B1 | 10/2005 | Ahn et al. |
| 6,979,855 B1 | 12/2005 | Ahn et al. |
| 2001/0002280 A1 | 5/2001 | Sneh |
| 2001/0009695 A1 | 7/2001 | Saanila et al. |
| 2001/0030352 A1 | 10/2001 | Ruff et al. |
| 2001/0042505 A1 | 11/2001 | Vaartstra |
| 2002/0001971 A1 | 1/2002 | Cho |
| 2002/0024080 A1 | 2/2002 | Derderian et al. |
| 2002/0025628 A1 | 2/2002 | Derderian et al. |
| 2002/0046705 A1 | 4/2002 | Sandhu et al. |
| 2002/0068466 A1 | 6/2002 | Lee et al. |

| | | |
|---|---|---|
| 2002/0086507 A1 | 7/2002 | Park et al. |
| 2002/0086555 A1 | 7/2002 | Ahn et al. |
| 2002/0089023 A1 | 7/2002 | Yu et al. |
| 2002/0100418 A1 | 8/2002 | Sandhu et al. |
| 2002/0102818 A1 | 8/2002 | Sandhu et al. |
| 2002/0110991 A1 | 8/2002 | Li |
| 2002/0111001 A1 | 8/2002 | Ahn |
| 2002/0122885 A1 | 9/2002 | Ahn |
| 2002/0130338 A1 | 9/2002 | Ahn et al. |
| 2002/0142536 A1 | 10/2002 | Zhang et al. |
| 2002/0146916 A1 | 10/2002 | Irino et al. |
| 2002/0155688 A1 | 10/2002 | Ahn et al. |
| 2002/0155689 A1 | 10/2002 | Ahn et al. |
| 2002/0164420 A1 | 11/2002 | Derderian et al. |
| 2002/0170671 A1 | 11/2002 | Matsushita et al. |
| 2002/0177244 A1 | 11/2002 | Hsu et al. |
| 2002/0192974 A1 | 12/2002 | Ahn et al. |
| 2002/0192975 A1 | 12/2002 | Ahn |
| 2002/0192979 A1 | 12/2002 | Ahn |
| 2002/0195056 A1 | 12/2002 | Sandhu et al. |
| 2003/0001241 A1 | 1/2003 | Chakrabarti et al. |
| 2003/0003702 A1 | 1/2003 | Ahn |
| 2003/0003722 A1 | 1/2003 | Vaartstra |
| 2003/0003730 A1 | 1/2003 | Li |
| 2003/0017717 A1 | 1/2003 | Ahn et al. |
| 2003/0027360 A1 | 2/2003 | Hsu et al. |
| 2003/0045060 A1 | 3/2003 | Ahn |
| 2003/0045078 A1 | 3/2003 | Ahn et al. |
| 2003/0048666 A1 | 3/2003 | Eldridge et al. |
| 2003/0049942 A1 | 3/2003 | Haukka et al. |
| 2003/0059535 A1 | 3/2003 | Luo et al. |
| 2003/0068848 A1 | 4/2003 | Hsu et al. |
| 2003/0072882 A1 | 4/2003 | Niinisto et al. |
| 2003/0104666 A1 | 6/2003 | Bojarczuk, Jr. et al. |
| 2003/0119246 A1 | 6/2003 | Ahn |
| 2003/0119291 A1 | 6/2003 | Ahn et al. |
| 2003/0119313 A1 | 6/2003 | Yang et al. |
| 2003/0124748 A1 | 7/2003 | Summerfelt et al. |
| 2003/0124791 A1 | 7/2003 | Summerfelt et al. |
| 2003/0132491 A1 | 7/2003 | Ahn |
| 2003/0157764 A1 | 8/2003 | Ahn et al. |
| 2003/0161081 A1 | 8/2003 | Girardie |
| 2003/0170389 A1 | 9/2003 | Sandhu |
| 2003/0170403 A1 | 9/2003 | Doan et al. |
| 2003/0175411 A1 | 9/2003 | Kodas et al. |
| 2003/0179521 A1 | 9/2003 | Girardie |
| 2003/0181039 A1 | 9/2003 | Sandhu et al. |
| 2003/0183156 A1 | 10/2003 | Dando et al. |
| 2003/0185980 A1* | 10/2003 | Endo ............. 427/255.23 |
| 2003/0205742 A1 | 11/2003 | Hsu et al. |
| 2003/0207032 A1 | 11/2003 | Ahn et al. |
| 2003/0207540 A1 | 11/2003 | Ahn et al. |
| 2003/0222300 A1 | 12/2003 | Basceri et al. |
| 2003/0227033 A1 | 12/2003 | Ahn et al. |
| 2003/0228747 A1 | 12/2003 | Ahn et al. |
| 2004/0004244 A1 | 1/2004 | Ahn et al. |
| 2004/0007171 A1 | 1/2004 | Ritala et al. |
| 2004/0009679 A1 | 1/2004 | Yeo et al. |
| 2004/0013009 A1 | 1/2004 | Tsunoda et al. |
| 2004/0023461 A1 | 2/2004 | Ahn et al. |
| 2004/0033661 A1 | 2/2004 | Yeo et al. |
| 2004/0033681 A1 | 2/2004 | Ahn et al. |
| 2004/0033701 A1 | 2/2004 | Ahn et al. |
| 2004/0038554 A1 | 2/2004 | Ahn |
| 2004/0043541 A1 | 3/2004 | Ahn |
| 2004/0043569 A1 | 3/2004 | Ahn |
| 2004/0043635 A1 | 3/2004 | Vaartstra |
| 2004/0076035 A1 | 4/2004 | Saito et al. |
| 2004/0104439 A1 | 6/2004 | Haukka et al. |
| 2004/0106249 A1 | 6/2004 | Huotari |
| 2004/0110348 A1 | 6/2004 | Ahn et al. |
| 2004/0110391 A1 | 6/2004 | Ahn et al. |
| 2004/0134365 A1 | 7/2004 | Ahn et al. |
| 2004/0135186 A1 | 7/2004 | Yamamoto |
| 2004/0144980 A1 | 7/2004 | Ahn et al. |
| 2004/0156578 A1 | 8/2004 | Geusic et al. |
| 2004/0159863 A1 | 8/2004 | Eldridge et al. |
| 2004/0164357 A1 | 8/2004 | Ahn et al. |
| 2004/0164365 A1 | 8/2004 | Ahn et al. |
| 2004/0168627 A1 | 9/2004 | Conley, Jr. et al. |
| 2004/0171280 A1 | 9/2004 | Conley, Jr. et al. |
| 2004/0175882 A1 | 9/2004 | Ahn et al. |
| 2004/0183108 A1 | 9/2004 | Ahn |
| 2004/0185654 A1 | 9/2004 | Ahn |
| 2004/0203254 A1 | 10/2004 | Conley, Jr. et al. |
| 2004/0214399 A1 | 10/2004 | Ahn et al. |
| 2004/0219783 A1 | 11/2004 | Ahn et al. |
| 2004/0222476 A1 | 11/2004 | Ahn et al. |
| 2004/0233010 A1 | 11/2004 | Akram et al. |
| 2004/0235313 A1 | 11/2004 | Frank et al. |
| 2004/0262700 A1 | 12/2004 | Ahn et al. |
| 2004/0264236 A1 | 12/2004 | Chae et al. |
| 2004/0266217 A1 | 12/2004 | Kim et al. |
| 2005/0009370 A1 | 1/2005 | Ahn |
| 2005/0020017 A1 | 1/2005 | Ahn et al. |
| 2005/0023574 A1 | 2/2005 | Forbes et al. |
| 2005/0023594 A1 | 2/2005 | Ahn et al. |
| 2005/0023595 A1 | 2/2005 | Forbes et al. |
| 2005/0023602 A1 | 2/2005 | Forbes et al. |
| 2005/0023603 A1 | 2/2005 | Eldridge et al. |
| 2005/0023624 A1 | 2/2005 | Ahn et al. |
| 2005/0023625 A1 | 2/2005 | Ahn et al. |
| 2005/0023626 A1 | 2/2005 | Ahn et al. |
| 2005/0024092 A1 | 2/2005 | Forbes et al. |
| 2005/0026349 A1 | 2/2005 | Forbes et al. |
| 2005/0026360 A1 | 2/2005 | Geusic et al. |
| 2005/0026458 A1 | 2/2005 | Basceri et al. |
| 2005/0029547 A1 | 2/2005 | Ahn et al. |
| 2005/0029604 A1 | 2/2005 | Ahn et al. |
| 2005/0029605 A1 | 2/2005 | Ahn et al. |
| 2005/0030825 A1 | 2/2005 | Ahn |
| 2005/0032292 A1 | 2/2005 | Ahn et al. |
| 2005/0032342 A1 | 2/2005 | Forbes et al. |
| 2005/0034662 A1 | 2/2005 | Ahn |
| 2005/0037563 A1 | 2/2005 | Ahn |
| 2005/0051828 A1* | 3/2005 | Park et al. ............. 257/310 |
| 2005/0054165 A1 | 3/2005 | Ahn et al. |
| 2005/0077519 A1 | 4/2005 | Ahn et al. |
| 2005/0087134 A1 | 4/2005 | Ahn |
| 2005/0124174 A1 | 6/2005 | Ahn et al. |
| 2005/0138262 A1 | 6/2005 | Forbes |
| 2005/0140462 A1 | 6/2005 | Akram et al. |
| 2005/0145957 A1 | 7/2005 | Ahn et al. |
| 2005/0164521 A1 | 7/2005 | Ahn et al. |
| 2005/0227442 A1 | 10/2005 | Ahn et al. |
| 2005/0277256 A1 | 12/2005 | Ahn et al. |

FOREIGN PATENT DOCUMENTS

| | | |
|---|---|---|
| EP | 1124262 | 8/2001 |
| WO | WO-01/97257 | 12/2001 |
| WO | WO-02/31875 | 4/2002 |
| WO | WO-02/43115 | 5/2002 |

OTHER PUBLICATIONS

Copel, M., et al., "Formation of a stratified lanthanum silicate dielectric by reaction with Si(001)", *Applied Physics Letters, 78(11)*, (Mar. 12, 2001), 1607-1609.

Dimoulas, A., et al., "Structural and electrical quality of the high-k dielectric $Y_2O_3$ on Si (001): Dependence on growth parameters", *Journal of Applied Physics, 92(1)*, (Jul. 1, 2002), 426-431.

Geller, S., et al., "Crystallographic Studies of Perovskite-like Compounds. II. Rare Earth Aluminates", *Acta Cryst., 9*, (May 1956), 1019-1025.

Giess, E. A., et al., "Lanthanide gallate perovskite-type substrates for epitaxial, high-T/sub c/ superconducting Ba/sub 2/YCu/sub 3/O/sub 7- delta / films", *IBM Journal of Research and Development, 34(6)*, (Nov. 1990), 916-926.

Guha, S, et al., "Atomic beam deposition of lanthanum-and yttrium-based oxide thin films for gate dielectrics", *Applied Physics Letters, 77*, (2000), 2710-2712.

Huang, C. H., et al., "La/sub 2/O/sub 3//Si/sub 0.3/Ge/sub 0.7/ p-MOSFETs with high hole mobility and good device characteristics", *IEEE Electron Device Letters, 23(12)*, (Dec. 2002), 710-712.

Hubbard, K. J., "Thermodynamic stability of binary oxides in contact with silicon", *Journal of Materials Research, 11(11)*, (Nov. 1996), 2757-2776.

Iwai, H., et al., "Advanced gate dielectric materials for sub-100 nm CMOS", *International Electron Devices Meeting, 2002. IEDM '02. Digest.*, (Dec. 8-11, 2002), 625-628.

Jeon, Sanghun, et al., "Excellent electrical characteristics of lanthanide (Pr, Nd, Sm, Gd, and Dy) oxide and lanthanide-doped oxide for MOS gate dielectric applications", *Electron Devices Meeting, 2001. IEDM Technical Digest. International*, (2001), 471-474.

Kim, D., et al., "Atomic Control of Substrate Termination and Heteroepitaxial Growth of SrTiO3/LaAlO3 Films", *Journal of the Korean Physical Society, 36(6)*, (Jun. 2000), 444-448.

Kwo, J., et al., "High E gate dielectrics Gd2O3 and Y2O3 for silicon", *Applied Physics Letters, 77(1)*, (Jul. 3, 2000), 130-132.

Kwo, J., et al., "Properties of high k gate dielectrics Gd2O3 and Y2O3 for Si", *Journal of Applied Physics, 89(7)*, (2001), 3920-3927.

Lee, A E., et al., "Epitaxially grown sputtered LaAlO3 films", *Applied Physics Letters, 57(19)*, (Nov. 1990), 2019-2021.

Maria, J. P., et al., "High temperature stability in lanthanum and zirconia-based gate dielectrics", *Journal of Applied Physics, 90(7)*, (Oct. 1, 2001), 3476-3482.

Michaelson, Herbert B., "The work function of the elements and its periodicity", *Journal of Applied Physics, 48(11)*, (Nov. 1977), 4729-4733.

Molodyk, A A., et al., "Volatile Surfactant-Assisted MOCVD: Application to LaAlO3 Thin Film Growth", *Chemical Vapor Deposition, 6(3)*, (Jun. 2000), 133-138.

Nieminen, Minna, et al., "Formation and stability of lanthanum oxide thin films deposited from B-diketonate precursor", *Applied Surface Science, 174(2)*, (Apr. 16, 2001), 155-165.

Osten, H. J., et al., "High-k gate dielectrics with ultra-low leakage current based on praseodymium oxide", *International Electron Devices Meeting 2000. Technical Digest. IEDM*, (2000), 653-656.

Park, Byung-Eun, et al., "Electrical properties of LaAlO3/Si and Sr0.8Bi2.2Ta2O9/LaAlO3/Si structures", *Applied Physics Letters, 79(6)*, (Aug. 2001), 806-808.

Robertson, J., "Band offsets of wide-band-gap oxides and implications for future electronic devices", *Journal of Vacuum Science & Technology B (Microelectronics and Nanometer Structures), 18(3)*, (May-Jun. 2000), 1785-1791.

Shimizu, Takashi, et al., "Electrical Properties of Ruthenium/Metalorganic Chemical Vapor Deposited La-Oxide/Si Field Effect Transistors", *Jpn. J. Appl. Phys., vol. 42, Part 2, No. 11A*, (2003), L1315-L1317.

Sneh, Ofer, et al., "Thin film atomic layer deposition equipment for semiconductor processing", *Thin Solid Films, 402(1-2)*, (Jan. 2002), 248-261.

Suntola, T., "Atomic Layer Epitaxy", *Handbook of Crystal Growth, 3; Thin Films of Epitaxy, Part B: Growth Mechanics and Dynamics*, Amsterdam, (1994), 602-663.

Suntola, T, "Atomic layer epitaxy", *Thin Solid Films, 216(1)*, (Aug. 28, 1992), 84-89.

Yamada, Hirotoshi, et al., "MOCVD of High-Dielectric-Constant Lanthanum Oxide Thin Films", *Journal of The Electrochemical Society, 150(8)*, (Aug. 2003), G429-G435.

Zhang, H., "Atomic Layer Deposition of High Dielectric Constant Nanolaminates", *Journal of The Electrochemical Society, 148(4)*, (Apr. 2001), F63-F66.

Zhang, H, "High permittivity thin film nanolaminates", *Journal of Applied Physics, 87(4)*, (Feb. 2000), 1921-1924.

Zhong, Huicai, et al., "Electrical Properties of Ru and RuO2 Gate Electrodes for Si-PMOSFET with ZrO2 and Zr-Silicate Dielectrics", *Journal of Electronic Materials, 30(12)*, (Dec. 2001), 1493.

Ahn, Kie Y., et al., "ALD of Amorphous Lanthanide Doped TiOx Films", U.S. Appl. No. 11/092,072; filed Mar. 29, 2005.

Ahn, Kie Y., et al., "Atomic Layer Deposited Hafnium Tantalum Oxide Dielectrics", U.S. Appl. No. 11/029,757; filed Jan. 5, 2005.

Ahn, Kie Y., et al., "Atomic Layer Deposited Lanthanum Aluminum Oxide Dielectric Layer", U.S. Appl. No. 10/930,167; filed Aug. 31, 2004.

Ahn, Kie Y., et al., "Atomic Layer Deposited Lanthanum Hafnium Oxide Dielectrics", U.S. Appl. No. 11/010,529; filed Dec. 13, 2004.

Ahn, Kie Y., et al., "Atomic Layer Deposited Titanium Aluminum Oxide Films", U.S. Appl. No. 10/931,533; filed Aug. 31, 2004.

Ahn, Kie Y., et al., "Atomic Layer Deposition of Hf3N4/HfO2 Films as Gate Dielectrics", U.S. Appl. No. 11/063,717; filed Feb. 23, 2005.

Ahn, Kie Y., et al., "Atomic Layer Deposition of Zirconium-Doped Tantalum Oxide Films", U.S. Appl. No. 10/909,959; filed Aug. 2, 2004.

Ahn, Kie Y., et al., "Atomic Layer Deposition of Zr3N4/ZrO2 Films as Gate Dielectrics", U.S. Appl. No. 11/058,563; filed Feb. 15, 2005.

Ahn, Kie Y., et al., "Hybrid ALD-CVD of PrXOY/ZrO2 Films as Gate Dielectrics", U.S. Appl. No. 11/010,766; filed Dec. 13, 2004.

Guha, S., et al., "High temperature stability of Al2O3 dielectrics on Si: Interfacial metal diffusion and mobility degradation", *Applied Physics Letters*, vol. 81, No. 16, (Oct. 14, 2002), 2956-2958.

U.S. Appl. No. 09/945,535 filed Aug. 30, 2001, Highly Reliable Amorphous High-K Gate Oxide ZrO2.

U.S. Appl. No. 10/027,315 filed Dec. 20, 2001, Low-Temperature Grown High-Quality Ultra Thin Praseodymium Gate Dielectrics.

U.S. Appl. No. 10/081,439 filed Feb. 20, 2002, Evaporated LaAlO3 Films for Gate Dielectrics.

U.S. Appl. No. 10/137,058 filed May 2, 2002, Atomic Layer Deposition and Conversion.

U.S. Appl. No. 10/137,168 filed May 2, 2002, Methods for Atomic-Layer Deposition of Aluminum Oxides in Integrated Circuits.

U.S. Appl. No. 10/137,499 filed May 2, 2002, Atomic-Layer Deposited LaAlO3 Films for Gate Dielectrics.

U.S. Appl. No. 10/163,481 filed Jun. 5, 2002, Atomic-Layer Deposited HfAlO3 Films for Gate Dielectrics.

U.S. Appl. No. 10/163,686 filed Jun. 5, 2002, A Method Including Forming Gate Dielectrics Having Multiple Lanthanide Oxide Layers.

U.S. Appl. No. 10/209,581 filed Jul. 30, 2002, Atomic-Layer Deposited Nanolaminate of HfO2/ZrO2 Films as Gate Dielectrics.

U.S. Appl. No. 10/229,903 filed Aug. 28, 2002, Atomic Layer Deposited HfSiON Dielectric Films.

U.S. Appl. No. 10/233,309 filed Aug. 29, 2002, Atomic Layer Deposited Lanthanide Doped TiOx Dielectric Films.

U.S. Appl. No. 10/309,583 filed Dec. 4, 2002, Atomic Layer Deposited Zr-Sn-Ti-O Films Using TiI4.

U.S. Appl. No. 10/309,935 filed Dec. 4, 2002, Atomic Layer Deposited Zr-Sn-Ti-O Films.

U.S. Appl. No. 10/379,470 filed Mar. 4, 2003, Atomic Layer Deposited Dielectric Layers.

U.S. Appl. No. 10/403,734 filed Mar. 31, 2003, Atomic Layer Deposited ZrAlxOy Dielectric Layers.

U.S. Appl. No. 10/420,307 filed Apr. 22, 2003, Atomic Layer Deposited ZrTiO4 Films.

U.S. Appl. No. 10/602,323 filed Jun. 24, 2003, Lanthanide Oxide/Halfnium Oxide Dielectric Layers.

U.S. Appl. No. 10/602,315 filed Jun. 24, 2003, Lanthanide Oxide/Halfnium Oxide Dielectric Layers.

U.S. Appl. No. 10/765,619 filed Jan. 27, 2004, High-Quality Praseodymium Gate Dielectrics (As Amended).

U.S. Appl. No. 10/768,597 filed Jan. 30, 2004, Low-Temperature Grown High-Quality Ultra-Thin Praseodymium Gate Dielectrics.

U.S. Appl. No. 10/789,042 filed Feb. 27, 2004, Atomic Layer-Deposited LaAlO3 Films for Gate Dielectrics.

U.S. Appl. No. 10/789,044 filed Feb. 27, 2004, Lanthanide Doped TiOx Dielectric Films.

U.S. Appl. No. 10/909,959 filed Aug. 2, 2004, Atomic Layer Deposition of Zirconium-Doped Tantalum Oxide Films.

U.S. Appl. No. 10/863,953 filed Jun. 9, 2004, Highly Reliable Amorphous High-k Gate Dielectric ZrOxNy.

U.S. Appl. No. 10/931,533 filed Aug. 31, 2004, Atomic Layer Deposited Titanium Aluminum Oxide Films.

U.S. Appl. No. 10/930,167 filed Aug. 31, 2004, Atomic Layer Deposited Lanthanum Aluminum Oxide Dielectric Layer.

U.S. Appl. No. 10/929,272 filed Aug. 30, 2004, Atomic Layer Deposition and Conversion.

U.S. Appl. No. 10/930,184 filed Aug. 31, 2004, Crystalline or Amorphous Medium-K Gate Oxides, Y2O3 and GD2O3.

U.S. Appl. No. 10/930,516 filed Aug. 31, 2004, Atomic Layer Deposited HfSiON Dielectric Films.

U.S. Appl. No. 10/931,341 filed Aug. 31, 2004, Atomic Layer Deposited Zr-Sn-Ti-O Films Using TiI4.

U.S. Appl. No. 10/930,431 filed Aug. 31, 2004, Atomic Layer-Deposited HfAlO3 Films for Gate Dielectrics.

U.S. Appl. No. 10/931,365 filed Aug. 31, 2004, Pr2)3-Based La-oxide Gate Dielectrics.

U.S. Appl. No. 10/931,364 filed Aug. 31, 2004, Lanthanide Doped TiOx Dielectric Films by Plasma Oxidation.

U.S. Appl. No. 10/931,343 filed Aug. 31, 2004, Lanthanide Oxide/Halfnium Oxide Dielectric Layers.

U.S. Appl. No. 10/931,340 filed Aug. 31, 2004, Lanthanide Oxide/Halfnium Oxide Dielectrics.

U.S. Appl. No. 10/931,845 filed Aug. 31, 2004, Methods, Systems, and Apparatus for Uniform Chemical-Vapor Depositions.

U.S. Appl. No. 10/931,595 filed Aug. 31, 2004, Methods, Systems, and Apparatus for Uniform Chemical-Vapor Depositions.

U.S. Appl. No. 10/931,356 filed Aug. 31, 2004, Highly Reliable Amorphous High-K Gate Oxide ZrO2.

U.S. Appl. No. 11/010,529 filed Dec. 13, 2004, Atomic Layer Deposited Lanthanum Halfnium Oxide Dielectrics.

U.S. Appl. No. 11/029,757 filed Jan. 5, 2005, Atomic Layer Deposited Halfnium Tantalum Oxide Dielectrics.

U.S. Appl. No. 11/010,766 filed Dec. 13, 2004, Hybrid ALD-CVD of PrXOY/ZrO2 Films as Gate Dielectrics.

U.S. Appl. No. 11/055,380 filed Feb. 10, 2005, Atomic Layer Deposition of CeO2/Al2O3 Films as Gate Dielectrics.

U.S. Appl. No. 11/053,577 filed Feb. 8, 2005, Atomic Layer Deposition of DY-Doped HfO2 Films as Gate Dielectrics.

U.S. Appl. No. 11/058,563 filed Feb. 15, 2005, Atomic Layer Deposition of Zr3N4/ZrO2 Films as Gate Dielectrics.

U.S. Appl. No. 11/063,717 filed Feb. 23, 2005, Atomic Layer Deposition of Hf3N4/HfO2 Films as Gate Dielectrics.

U.S. Appl. No. 11/031,289 filed Jan. 7, 2005, Lanthanide Doped TiOx Dielectric Films by Plasma Oxidation.

U.S. Appl. No. 11/059,594 filed Feb. 16, 2005, Evaporated LaAlO3 Films for Gate Dielectrics.

U.S. Appl. No. 11/092,072 filed Mar. 29, 2005, ALD of Amorpohous Lanthanide-Doped TiOx Films.

U.S. Appl. No. 11/093,104 filed Mar. 29, 2005, Atomic Layer Deposited Titanium Silicon Oxide Films.

U.S. Appl. No. 11/084,968 filed Mar. 21, 2005, Zr-Sn-Ti-O Films.

* cited by examiner

LANTHANIDE OXIDE DIELECTRIC LAYER

TECHNICAL FIELD

This application relates generally to semiconductor devices and device fabrication and, more particularly, to dielectric layers and their method of fabrication.

BACKGROUND

The semiconductor device industry has a market driven need to reduce the size of devices such as transistors. To reduce transistor size, the thickness of the silicon dioxide, $SiO_2$, gate dielectric is reduced in proportion to the shrinkage of the gate length. For example, a metal-oxide-semiconductor field effect transistor (MOSFET) would use a 1.5 nm thick $SiO_2$ gate dielectric for a gate length of 70 nm. A goal is to fabricate increasingly smaller and more reliable integrated circuits (ICs) for use in products such as processor chips, mobile telephones, and memory devices such as dynamic random access memories (DRAMs).

Currently, the semiconductor industry relies on the ability to reduce or scale the dimensions of its basic devices, primarily, the silicon based MOSFET. This device scaling includes scaling the gate dielectric, which has primarily been fabricated using silicon dioxide. A thermally grown amorphous $SiO_2$ layer provides an electrically and thermodynamically stable material, where the interface of the $SiO_2$ layer with underlying silicon provides a high quality interface as well as superior electrical isolation properties. However, increased scaling and other requirements in microelectronic devices have created the need to use other dielectric materials as gate dielectrics.

SUMMARY

The abovementioned problems are addressed by the present invention and will be understood by reading and studying the following specification. An embodiment for a method for forming an electronic device includes forming a dielectric layer containing a lanthanide oxide layer, where the lanthanide oxide layer is formed by atomic layer deposition. In various embodiments, the atomic layer deposition process uses a trisethylcyclopentadionatolanthanum precursor and/or a trisdipyvaloylmethanatolanthanum precursor. In an embodiment, a conductive layer containing ruthenium is deposited to contact the dielectric layer. Embodiments include structures for capacitors, transistors, memory devices, and electronic systems with dielectric layers containing an atomic layer deposited lanthanide oxide layer, and methods for forming such structures. These and other aspects, embodiments, advantages, and features will become apparent from the following description and the referenced drawings.

DETAILED DESCRIPTION

Figure 1:
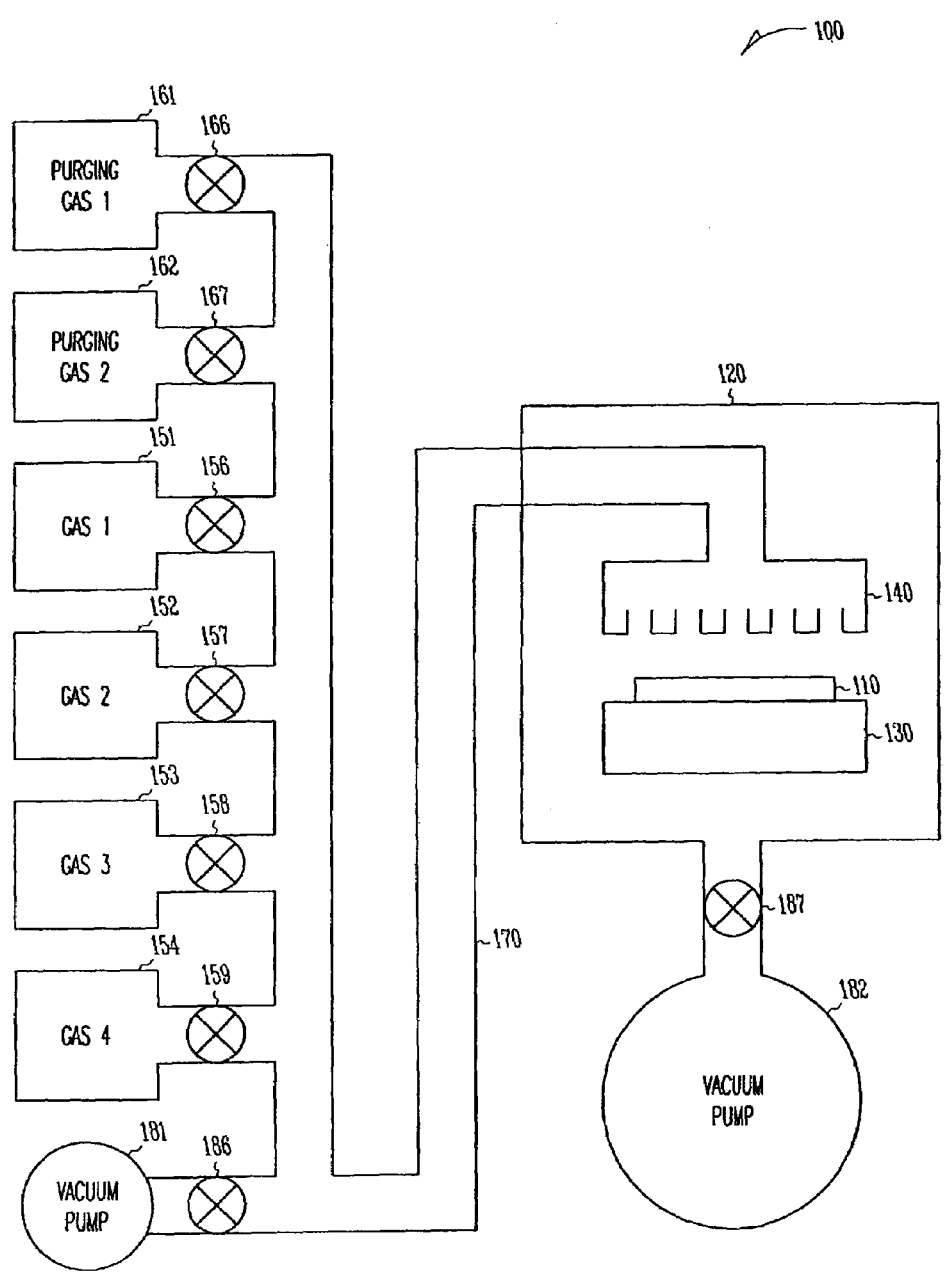
FIG. 1 depicts an atomic layer deposition system for fabricating a dielectric layer containing a lanthanide oxide layer, according to various embodiments of the present invention.

The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized and structural, logical, and electrical changes may be made without departing from the scope of the present invention. The various embodiments are not necessarily mutually exclusive, as some embodiments can be combined with one or more other embodiments to form new embodiments.

The terms wafer and substrate used in the following description include any structure having an exposed surface with which to form an integrated circuit (IC) structure. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to generally include n-type and p-type semiconductors and the term insulator or dielectric is defined to include any material that is less electrically conductive than the materials referred to as conductors or as semiconductors.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

A gate dielectric in a transistor has both a physical gate dielectric thickness and an equivalent oxide thickness ($t_{eq}$). The equivalent oxide thickness quantifies the electrical properties, such as capacitance, of the gate dielectric in terms of a representative physical thickness. $t_{eq}$ is defined as the thickness of a theoretical $SiO_2$ layer that would be required to have the same capacitance density as a given dielectric, ignoring leakage current and reliability considerations.

A $SiO_2$ layer of thickness, t, deposited on a Si surface as a gate dielectric will have a $t_{eq}$ larger than its thickness, t. This $t_{eq}$ results from the capacitance in the surface channel on which the $SiO_2$ is deposited due to the formation of a depletion/inversion region. This depletion/inversion region can result in $t_{eq}$ being from 3 to 6 Angstroms (Å) larger than the $SiO_2$ thickness, t. Thus, with the semiconductor industry driving to someday scale the gate dielectric equivalent oxide thickness to under 10 Å, the physical thickness requirement for a $SiO_2$ layer used for a gate dielectric would be need to be approximately 4 to 7 Å.

Additional requirements on a $SiO_2$ layer would depend on the gate electrode used in conjunction with the $SiO_2$ gate dielectric. Using a conventional polysilicon gate would result in an additional increase in $t_{eq}$ for the $SiO_2$ layer. This additional thickness could be eliminated by using a metal gate electrode, though metal gates are not currently used in typical complementary metal-oxide-semiconductor field effect transistor (CMOS) technology. Thus, future devices would be designed towards a physical $SiO_2$ gate dielectric layer of about 5 Å or less. Such a small thickness requirement for a $SiO_2$ oxide layer creates additional problems.

Silicon dioxide is used as a gate dielectric, in part, due to its electrical isolation properties in a $SiO_2$—Si based structure. This electrical isolation is due to the relatively large band gap of $SiO_2$ (8.9 eV) making it a good insulator from electrical conduction. Signification reductions in its band gap would eliminate it as a material for a gate dielectric. As the thickness of a $SiO_2$ layer decreases, the number of atomic layers, or monolayers of the material in the thickness decreases. At a certain thickness, the number of monolayers will be sufficiently small that the $SiO_2$ layer will not have a complete arrangement of atoms as in a larger or bulk layer. As a result of incomplete formation relative to a bulk structure, a thin $SiO_2$ layer of only one or two monolayers will not form a full band gap. The lack of a full band gap in a $SiO_2$ gate dielectric would cause an effective short between an underlying Si channel and an overlying polysilicon gate. This undesirable property sets a limit on the physical thickness to which a $SiO_2$ layer can be scaled. The minimum thickness due to this monolayer effect is thought to be about 7–8 Å. Therefore, for future devices to have a $t_{eq}$ less than about 10 Å, other dielectrics than $SiO_2$ need to be considered for use as a gate dielectric.

For a typical dielectric layer used as a gate dielectric, the capacitance is determined as one for a parallel plate capacitance: $C = k\epsilon_0 A/t$, where k is the dielectric constant, $\epsilon_0$ is the permittivity of free space, A is the area of the capacitor, and t is the thickness of the dielectric. The thickness, t, of a material is related to its $t_{eq}$ for a given capacitance, with $SiO_2$ having a dielectric constant $k_{ox}=3.9$, as $$t=(k/k_{ox})t_{eq}=(k/3.9)t_{eq}.$$

Thus, materials with a dielectric constant greater than that of $SiO_2$, 3.9, will have a physical thickness that can be considerably larger than a desired $t_{eq}$, while providing the desired equivalent oxide thickness. For example, an alternate dielectric material with a dielectric constant of 10 could have a thickness of about 25.6 Å to provide a $t_{eq}$ of 10 Å, not including any depletion/inversion layer effects. Thus, a reduced equivalent oxide thickness for transistors can be realized by using dielectric materials with higher dielectric constants than $SiO_2$.

The thinner equivalent oxide thickness required for lower transistor operating voltages and smaller transistor dimensions may be realized by a significant number of materials, but additional fabricating requirements makes determining a suitable replacement for $SiO_2$ difficult. The current view for the microelectronics industry is still for Si based devices. This requires that the gate dielectric employed be grown on a silicon substrate or silicon layer, which places significant constraints on the substitute dielectric material. During the formation of the dielectric on the silicon layer, there exists the possibility that a small layer of $SiO_2$ could be formed in addition to the desired dielectric. The result would effectively be a dielectric layer consisting of two sublayers in parallel with each other and the silicon layer on which the dielectric is formed. In such a case, the resulting capacitance would be that of two dielectrics in series. As a result, the $t_{eq}$ of the dielectric layer would be the sum of the $SiO_2$ thickness and a multiplicative factor of the thickness, t, of the dielectric being formed, written as $$t_{eq}=t_{SiO2}+(k_{ox}/k)t.$$

Thus, if a $SiO_2$ layer is formed in the process, the $t_{eq}$ is again limited by a $SiO_2$ layer. In the event that a barrier layer is formed between the silicon layer and the desired dielectric in which the barrier layer prevents the formation of a $SiO_2$ layer, the $t_{eq}$ would be limited by the layer with the lowest dielectric constant. However, whether a single dielectric layer with a high dielectric constant or a barrier layer with a higher dielectric constant than $SiO_2$ is employed, the layer interfacing with the silicon layer must provide a high quality interface to maintain a high channel carrier mobility.

One of the advantages using $SiO_2$ as a gate dielectric has been that the formation of the $SiO_2$ layer results in an amorphous gate dielectric. Having an amorphous structure for a gate dielectric provides for reducing problems of leakage current associated with grain boundaries in polycrystalline gate dielectrics that provide high leakage paths. Additionally, grain size and orientation changes throughout a polycrystalline gate dielectric can cause variations in the film's dielectric constant, along with uniformity and surface topography problems. Typically, materials having the advantage of a high dielectric constant relative to $SiO_2$ also have the disadvantage of a crystalline form, at least in a bulk configuration. The best candidates for replacing $SiO_2$ as a gate dielectric are those with high dielectric constant, which can be fabricated as a thin layer with an amorphous form.

Candidates to replace $SiO_2$ include high-k dielectric materials. High-k materials include materials having a dielectric constant greater than silicon dioxide, for example, dielectrics materials having a dielectric constant greater than about twice the dielectric constant of silicon dioxide. An appropriate high-k gate dielectric should have a large energy gap ($E_g$) and large energy barrier heights with Si for both electrons and holes. Generally, the bandgap is inversely related to the dielectric constant for a high-k material, which lessens some advantages of the high-k material. A set of high-k dielectric candidates for replacing silicon oxide as the dielectric material in electronic components in integrated circuit includes the lanthanide oxides such as $La_2O_3$, $Pr_2O_3$, $Nd_2O_3$, $Sm_2O_3$, $Gd_2O_3$, $Dy_2O_3$, $Ce_2O_3$, $Tb_2O_3$, $Er_2O_3$, $Eu_2O_3$, $Lu_2O_3$, $Tm_2O_3$, $Ho_2O_3$, $Pm_2O_3$, and $Yb_2O_3$. Other candidates include lanthanide silicates. Embodiments of dielectric layers containing an atomic layer deposited lanthanide oxide layer have a larger dielectric constant than silicon dioxide. Such dielectric layers provide a significantly thinner equivalent oxide thickness compared with a silicon oxide layer having the same physical thickness. Alternately, such dielectric layers provide a significantly thicker physical thickness than a silicon oxide layer having the same equivalent oxide thickness. This increased physical thickness aids in reducing leakage current.

In an embodiment, a lanthanide oxide layer is formed in an integrated circuit by atomic layer deposition using a trisethylcyclopentadionatolanthanum precursor. In an embodiment, a lanthanide oxide layer is formed in an integrated circuit by atomic layer deposition using a tris-dipyvaloylmethanatolanthanum precursor. In an embodiment, the lanthanide oxide layer may be formed substantially as a lanthanum oxide layer. In an embodiment, a lanthanide oxide layer may be formed as a combination of layers having at least one lanthanum oxide layer along with layers of one or more other lanthanide oxides. Alternately, a lanthanide oxide layer may be formed as a combination of lanthanum oxide and other lanthanide oxides in which the lanthanide oxides are configured throughout the lanthanide oxide layer without restriction to layers of the individual lanthanide oxides.

However, lanthanide oxide dielectrics on a silicon substrate tend to lead to large flatband voltage shifts, which may be attributed to fixed oxide charges located near the interface between the lanthanide oxide layer and the silicon. The source of this fixed oxide charge may be due to an interface reaction of a metal gate, such as aluminum, with the lanthanide oxide on which the metal gate is disposed. This metal gate interface reaction may induce a portion of the fixed oxide charges.

In an embodiment, a ruthenium metal layer is disposed on the lanthanide oxide layer as an electrode, gate, or direct conductive contact depending on the application of the lanthanide oxide dielectric as a component of an electronic device in an integrated circuit. A ruthenium metal layer, such as for a gate metal, is used to avoid or prevent a reaction between the gate metal and the lanthanide oxide layer. Generally, ruthenium is more inert than polysilicon and metals such as aluminum and tantalum, has a resistivity as low as 7.5 $\mu\Omega m$, and has a melting point of 2450° C. The ruthenium metal layer may be deposited by a physical vapor deposition, evaporation, sputtering, chemical vapor deposition, and metalorganic chemical vapor deposition. The ruthenium metal layer may be shaped by reactive ion etching. The ruthenium gate contacting an atomic layer deposited lanthanide oxide dielectric layer may be applied to fabrication processes of Damascene gate and dual gate MOSFETs.

In an embodiment, a conductive ruthenium oxide layer is disposed on the lanthanide oxide layer as an electrode, gate, or direct conductive contact depending on the application of the lanthanide oxide dielectric as a component of an electronic device in an integrated circuit. $RuO_2$ like ruthenium has a large work function in the range of approximately 5 eV, low resistivity, and good thermal stability. A layer of ruthenium oxide may be formed on a lanthanide oxide layer in an integrated circuit using techniques such as a physical vapor deposition, evaporation, sputtering, chemical vapor deposition, and metalorganic chemical vapor deposition.

Another consideration for selecting the material and method for forming a dielectric film for use in electronic devices and systems concerns the roughness of a dielectric film on a substrate. Surface roughness of the dielectric film has a significant effect on the electrical properties of the gate oxide, and the resulting operating characteristics of the transistor. The leakage current through a physical 1.0 nm gate oxide increases by a factor of 10 for every 0.1 increase in the root-mean-square (RMS) roughness.

During a conventional sputtering deposition process stage, particles of the material to be deposited bombard the surface at a high energy. When a particle hits the surface, some particles adhere, and other particles cause damage. High energy impacts remove body region particles creating pits. The surface of such a deposited layer can have a rough contour due to the rough interface at the body region.

In an embodiment, a lanthanide oxide dielectric film having a substantially smooth surface relative to other processing techniques is formed using atomic layer deposition (ALD). Further, forming such a dielectric film using atomic layer deposition can provide for controlling transitions between material layers. As a result of such control, atomic layer deposited lanthanide oxide dielectric films can have an engineered transition with a substrate surface.

ALD, also known as atomic layer epitaxy (ALE), is a modification of chemical vapor deposition (CVD) and is also called "alternatively pulsed-CVD." In ALD, gaseous precursors are introduced one at a time to the substrate surface mounted within a reaction chamber (or reactor). This introduction of the gaseous precursors takes the form of pulses of each gaseous precursor. In a pulse of a precursor gas, the precursor gas is made to flow into a specific area or region for a short period of time. Between the pulses, the reaction chamber is purged with a gas, which in many cases is an inert gas, and/or evacuated.

In a chemisorption-saturated ALD (CS-ALD) process, during the first pulsing phase, reaction with the substrate occurs with the precursor saturatively chemisorbed at the substrate surface. Subsequent pulsing with a purging gas removes precursor excess from the reaction chamber.

The second pulsing phase introduces another precursor on the substrate where the growth reaction of the desired film takes place. Subsequent to the film growth reaction, reaction byproducts and precursor excess are purged from the reaction chamber. With favourable precursor chemistry where the precursors adsorb and react with each other on the substrate aggressively, one ALD cycle can be preformed in less than one second in properly designed flow type reaction chambers. Typically, precursor pulse times range from about 0.5 sec to about 2 to 3 seconds.

In ALD, the saturation of all the reaction and purging phases makes the growth self-limiting. This self-limiting growth results in large area uniformity and conformality, which has important applications for such cases as planar substrates, deep trenches, and in the processing of porous silicon and high surface area silica and alumina powders. Significantly, ALD provides for controlling film thickness in a straightforward manner by controlling the number of growth cycles.

ALD was originally developed to manufacture luminescent and dielectric films needed in electroluminescent displays. Significant efforts have been made to apply ALD to the growth of doped zinc sulfide and alkaline earth metal sulfide films. Additionally, ALD has been studied for the growth of different epitaxial II–V and II–VI films, nonepitaxial crystalline or amorphous oxide and nitride films and multilayer structures of these. There also has been considerable interest towards the ALD growth of silicon and germanium films, but due to the difficult precursor chemistry, this has not been very successful.

The precursors used in an ALD process may be gaseous, liquid or solid. However, liquid or solid precursors should be volatile. The vapor pressure should be high enough for effective mass transportation. In addition, solid and some liquid precursors may need to be heated inside the reaction chamber and introduced through heated tubes to the substrates. The necessary vapor pressure should be reached at a temperature below the substrate temperature to avoid the condensation of the precursors on the substrate. Due to the self-limiting growth mechanisms of ALD, relatively low vapor pressure solid precursors can be used though evaporation rates may somewhat vary during the process because of changes in their surface area.

There are several other characteristics for precursors used in ALD. The precursors should be thermally stable at the substrate temperature because their decomposition would destroy the surface control and accordingly the advantages of the ALD method that relies on the reaction of the precursor at the substrate surface. A slight decomposition, if slow compared to the ALD growth, can be tolerated.

The precursors should chemisorb on or react with the surface, though the interaction between the precursor and the surface as well as the mechanism for the adsorption is different for different precursors. The molecules at the substrate surface should react aggressively with the second precursor to form the desired solid film. Additionally, precursors should not react with the film to cause etching, and precursors should not dissolve in the film. Using highly reactive precursors in ALD contrasts with the selection of precursors for conventional CVD.

The by-products in the reaction should be gaseous in order to allow their easy removal from the reaction chamber. Further, the by-products should not react or adsorb on the surface.

In a reaction sequence ALD (RS-ALD) process, the self-limiting process sequence involves sequential surface chemical reactions. RS-ALD relies on chemistry between a reactive surface and a reactive molecular precursor. In an RS-ALD process, molecular precursors are pulsed into the ALD reaction chamber separately. The metal precursor reaction at the substrate is typically followed by an inert gas pulse to remove excess precursor and by-products from the reaction chamber prior to pulsing the next precursor of the fabrication sequence.

By RS-ALD, films can be layered in equal metered sequences that are all identical in chemical kinetics, deposition per cycle, composition, and thickness. RS-ALD sequences generally deposit less than a full layer per cycle. Typically, a deposition or growth rate of about 0.25 to about 2.00 Å per RS-ALD cycle can be realized.

The advantages of RS-ALD include continuity at an interface avoiding poorly defined nucleating regions that are typical for chemical vapor deposition (<20 Å) and physical vapor deposition (<50 Å), conformality over a variety of substrate topologies due to its layer-by-layer deposition technique, use of low temperature and mildly oxidizing processes, lack of dependence on the reaction chamber, growth thickness dependent solely on the number of cycles performed, and ability to engineer multilayer laminate films with resolution of one to two monolayers. RS-ALD processes allows for deposition control on the order on monolayers and the ability to deposit monolayers of amorphous films.

Herein, a sequence refers to the ALD material formation based on an ALD reaction of a precursor followed by its reactant precursor. For example, forming lanthanum oxide from a $La(thd)_3$ (thd=2,2,6,6-tetramethl-3,5-heptanedione) precursor and ozone, as its reactant precursor, forms an embodiment of a lanthanum/oxygen sequence, which can also be referred to as lanthanum sequence. A cycle of a sequence includes pulsing a precursor, pulsing a purging gas for the precursor, pulsing a reactant precursor, and pulsing the reactant's purging gas.

In an embodiment, a layer of lanthanum oxide is formed on a substrate mounted in a reaction chamber using ALD in a repetitive sequence using precursor gases individually pulsed into the reaction chamber. An embodiment includes forming the lanthanum oxide using a trisethylcyclopentadionatolanthanum precursor gas. Alternately, the lanthanide oxide layer may be formed by atomic layer deposition using a trisdipyvaloylmethanatolanthanum precursor gas. Other solid or liquid precursors may be used in an appropriately designed reaction chamber.

FIG. 1 shows an embodiment of an atomic layer deposition system 100 for processing a dielectric film containing lanthanide oxide. The elements depicted permit discussion of the present invention such that those skilled in the art may practice the present invention without undue experimentation. In FIG. 1, a substrate 110 is located inside a reaction chamber 120 of ALD system 100. Also located within the reaction chamber 120 is a heating element 130, which is thermally coupled to substrate 110 to control the substrate temperature. A gas-distribution fixture 140 introduces precursor gases to the substrate 110. Each precursor gas originates from individual gas sources 151–154, whose flow is controlled by mass-flow controllers 156–159, respectively. Gas sources 151–154 provide a precursor gas either by storing the precursor as a gas or by providing a location and apparatus for evaporating a solid or liquid material to form the selected precursor gas.

Also included in the ALD system are purging gas sources 161, 162, each of which is coupled to mass-flow controllers 166, 167, respectively. Furthermore, additional purging gas sources can be constructed in ALD system 100, one purging gas source for each precursor gas, for example. For a process that uses the same purging gas for multiple precursor gases less purging gas sources are required for ALD system 100. Gas sources 151–154 and purging gas sources 161–162 are coupled by their associated mass-flow controllers to a common gas line or conduit 170, which is coupled to the gas-distribution fixture 140 inside the reaction chamber 120. Gas conduit 170 is also coupled to vacuum pump, or exhaust pump, 181 by mass-flow controller 186 to remove excess precursor gases, purging gases, and by-product gases at the end of a purging sequence from the gas conduit.

Vacuum pump, or exhaust pump, 182 is coupled by mass-flow controller 187 to remove excess precursor gases, purging gases, and by-product gases at the end of a purging sequence from reaction chamber 120. For convenience, control displays, mounting apparatus, temperature sensing devices, substrate maneuvering apparatus, and necessary electrical connections as are known to those skilled in the art are not shown in FIG. 1. Though ALD system 100 is well suited for practicing the present invention, other ALD systems commercially available can be used.

The use, construction and fundamental operation of reaction chambers for deposition of films are understood by those of ordinary skill in the art of semiconductor fabrication. The present invention may be practiced on a variety of such reaction chambers without undue experimentation. Furthermore, one of ordinary skill in the art will comprehend the necessary detection, measurement, and control techniques in the art of semiconductor fabrication upon reading the disclosure.

The elements of ALD system 100 can be controlled by a computer. To focus on the use of ALD system 100 in the various embodiments of the present invention, the computer is not shown. Those skilled in the art can appreciate that the individual elements such as pressure control, temperature control, and gas flow within ALD system 100 can be under computer control.

Figure 2:
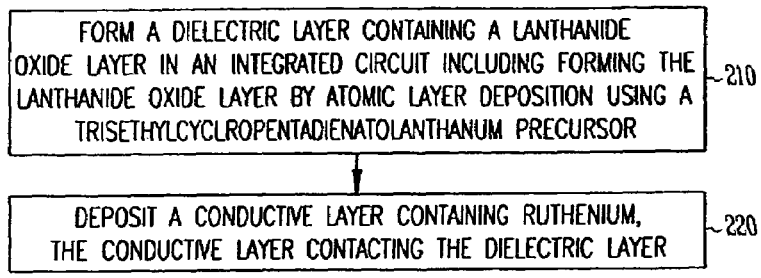
FIG. 2 illustrates a flow diagram of elements for an embodiment of a method to form a dielectric layer containing a lanthanide oxide layer by atomic layer deposition and a conductive layer contacting the dielectric layer, where the conductive layer contains ruthenium, according to various embodiments of the present invention.

FIG. 2 illustrates a flow diagram of elements for an embodiment of a method to form a dielectric layer containing a lanthanide oxide layer and a conductive layer contacting the dielectric layer, where the conductive layer contains ruthenium. At 210, a dielectric layer is forming containing a lanthanide oxide layer in an integrated circuit. The lanthanide oxide layer may include lanthanum oxide. In an embodiment, the lanthanum oxide is $La_2O_3$. Alternately, the lanthanum oxide formed may include non-stoichiometric forms of lanthanum oxide. The term, La-oxide, is used to include stoichiometric lanthanum oxide, non-stoichiometric, and compositions having stoichiometric and non-stoichiometric lanthanum oxide. In an embodiment, a La-oxide layer is formed by atomic layer deposition using a trisethylcyclopentadionatolanthanum $(La(EtCp)_3)$ precursor gas. Alternately, a La-oxide layer may be formed by atomic layer deposition using a trisdipyvaloylmethanatolanthanum $(La(DPM)_3)$ precursor gas. A number of precursors containing lanthanum may be used to deposit the lanthanum on a substrate for the integrated circuit. In addition, the pulsing of the lanthanum precursor may use a pulsing period that provides uniform coverage of a monolayer on the surface or may use a pulsing period that provides partial formation of a monolayer on the surface.

In an embodiment, the dielectric layer may be formed substantially as a lanthanide oxide layer. The lanthanide oxide layer may be formed substantially as a La-oxide layer. In an embodiment, a lanthanide oxide layer may be formed as a combination of layers having at least one La-oxide layer along with layers of other lanthanide oxides. Alternately, a lanthanide oxide layer may be formed as a combination of La-oxide and other lanthanide oxides in which the lanthanide oxides are configured throughout the lanthanide oxide layer without restriction to layers of the individual lanthanide oxides.

At 220, a conductive layer containing ruthenium is deposited such that the conductive layer contacts the dielectric layer. The conductive layer may be used in various embodiments as electrodes, gates, and direct contacts to the dielectric layer containing the atomic layer deposited lanthanide oxide for a wide variety of electronic devices. In an embodiment, the conductive layer may be formed substantially as a ruthenium metal layer. Alternately, the conductive layer may be formed substantially as a conductive ruthenium oxide layer. The conductive ruthenium oxide formed may be stoichiometric and/or non-stoichiometric.

Figure 3:
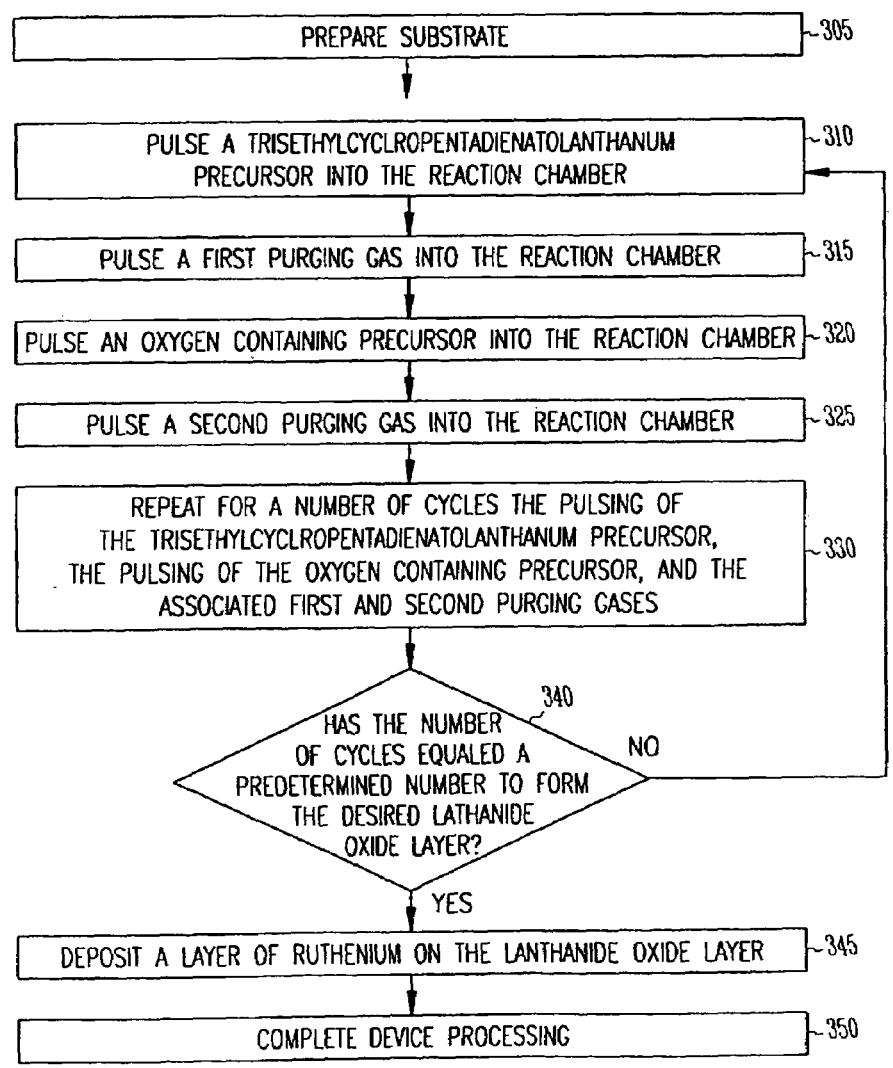
FIG. 3 illustrates a flow diagram of elements for an embodiment of a method to form a dielectric layer containing a lanthanide oxide layer by atomic layer deposition and a conductive layer contacting the dielectric layer, where the conductive layer contains ruthenium, according to the present invention.

FIG. 3 illustrates a flow diagram of elements for an embodiment of a method to form a dielectric layer containing an atomic layer deposited lanthanide oxide layer and a conductive layer contacting the dielectric layer, where the conductive layer contains ruthenium. This embodiment can be implemented with the atomic layer deposition system 100 of FIG. 1. At 305, a substrate 110 is prepared. The substrate used for forming a transistor is typically a silicon or silicon containing material. In other embodiments, germanium, gallium arsenide, silicon-on-sapphire substrates, or other suitable substrates may be used. This preparation process includes cleaning substrate 110 and forming layers and regions of the substrate, such as drains and sources of a metal oxide semiconductor (MOS) transistor, prior to forming a gate dielectric. In an embodiment, the substrate is cleaned to provide an initial substrate depleted of its native oxide. In an embodiment, the initial substrate is cleaned also to provide a hydrogen-terminated surface. In an embodiment, a silicon substrate undergoes a final hydrofluoric (HF) rinse prior to ALD processing to provide the silicon substrate with a hydrogen-terminated surface without a native silicon oxide layer.

Cleaning immediately preceding atomic layer deposition aids in reducing an occurrence of silicon oxide as an interface between a silicon based substrate and a lanthanide oxide dielectric formed using the atomic layer deposition process. The material composition and its properties of an interface layer are typically dependent on process conditions and the condition of the substrate before forming the dielectric layer. Though the existence of an interface layer may effectively reduce the dielectric constant associated with the dielectric layer and its substrate interface layer, a $SiO_2$ interface layer or other composition interface layer, may improve the interface density, fixed charge density, and channel mobility of a device having this interface layer.

The sequencing of the formation of the regions of the transistor being processed may follow typical sequencing that is generally performed in the fabrication of a MOS transistor as is well known to those skilled in the art. Included in the processing prior to forming a gate dielectric is the masking of substrate regions to be protected during the gate dielectric formation, as is typically performed in MOS fabrication. In this embodiment, the unmasked region includes a body region of a transistor, however one skilled in the art will recognize that other semiconductor device structures may utilize this process. Additionally, the substrate 110 in its ready for processing form is conveyed into a position in reaction chamber 120 for ALD processing.

At 310, a lanthanum containing precursor such as a $La(EtCp)_3$ precursor is pulsed into reaction chamber 120. The $La(EtCp)_3$ is pulsed into reaction chamber 120 through the gas-distribution fixture 140 onto substrate 110. The flow of the $La(EtCp)_3$ is controlled by mass-flow controller 156 from gas source 151, where the $La(EtCp)_3$ is maintained. In an embodiment, the substrate temperature is maintained at temperature ranging from about 400° C. to about 650° C. In an embodiment, the substrate temperature is maintained at about 650° C. Alternately, the substrate temperature may be maintained at temperatures less than 650° C. by heating element 130. The $La(EtCp)_3$ reacts with the surface of the substrate 110 in the desired region defined by the unmasked areas of the substrate 110. In other embodiments, $La(DPM)_3$ is used as a lanthanum containing precursor. In an embodiment, $H_2$ is pulsed along with the $La(EtCp)_3$ precursor or the $La(DPM)_3$ precursor to reduce carbon contamination in the deposited film. $La(EtCp)_3$ has a melting point of about 95° C. and has a vapor pressure that is significantly higher than the vapor pressure of $La(DPM)_3$. The use of $La(EtCp)_3$ and/or $La(DPM)_3$ as the lanthanum containing precursor may depend on the application of the electronic device being fabricated.

At 315, a first purging gas is pulsed into the reaction chamber 120. In an embodiment, nitrogen is used as a purging gas and a carrier gas. The nitrogen flow is controlled by mass-flow controller 166 from the purging gas source 161 into the as conduit 170. Using the pure nitrogen purge avoids overlap of the precursor pulses and possible gas phase reactions. In an embodiment, argon gas or other inert gas may be used as the purging gas. Following the purge, an oxygen containing precursor is pulsed into the reaction chamber 120, at 320.

For the lanthanum sequence using La(EtCp)$_3$ or La(DPM)$_3$ as the precursor, water vapor may be selected as the precursor acting as a reactant to form La-oxide on the substrate 110. The H$_2$O vapor is pulsed into the reaction chamber 120 through gas conduit 170 from gas source 152 by mass-flow controller 157. The water vapor aggressively reacts at the surface of substrate 110.

Following the pulsing of an oxygen containing precursor, a second purging gas is injected into the reaction chamber 120, at 325. Nitrogen gas may be used to purge the reaction chamber after pulsing each precursor gas in the lanthanum/oxygen sequence. In an embodiment, argon gas or other inert gas may be used as the purging gas. Excess precursor gas, and reaction by-products are removed from the system by the purge gas in conjunction with the exhausting of the reaction chamber 120 using vacuum pump 182 through mass-flow controller 187, and exhausting of the gas conduit 170 by the vacuum pump 181 through mass-flow controller 186.

At 330, the pulsing of the La(EtCp)$_3$ precursor, the pulsing of the oxygen containing precursor, and the pulsing of the first and second purging gas are repeated for a number of cycles. After repeating the lanthanum/oxygen sequence for a selected number of cycles, at 340, a determination is made as to whether the number of lanthanum cycles equals a predetermined number to form the desired lanthanide oxide layer. If the total number of cycles to form the desired thickness has not been completed, a number of cycles for the lanthanum/oxygen sequence is repeated, beginning again at 310, and the process continues. If the total number of cycles to form the desired thickness has been completed, the dielectric film containing the lanthanide oxide layer may optionally be annealed. The lanthanide oxide layer processed at these relatively low temperatures may provide an amorphous layer.

The thickness of a lanthanide oxide layer formed by atomic layer deposition is determined by a fixed growth rate for the pulsing periods and precursors used, set at a value such as N nm/cycle, dependent upon the number of cycles of the lanthanum sequence. For a desired lanthanide oxide layer thickness, t, in an application such as forming a gate dielectric of a MOS transistor, the ALD process is repeated for t/N total cycles. Once the t/N cycles have completed, no further ALD processing for the lanthanide oxide layer is required.

At 345, a conductive layer containing ruthenium is deposited on the lanthanide oxide layer. The conductive layer may be deposited as a layer of ruthenium. Ruthenium may be deposited using a number of techniques including, but not limited to, evaporation, sputtering, chemical vapor deposition (CVD), and metalorganic chemical vapor deposition (MOCVD). The ruthenium layer may be shaped by reactive ion etching (RIE) in a gas ambient having a CHF$_3$+O$_2$ mixture. Such metal layer shaping may be used to form a Ru gate in metal oxide semiconductor field transistors (MOSFETs). Alternately, the conductive layer may be formed as a layer of conductive ruthenium oxide. Ruthenium oxide may be formed using a number of techniques including, but not limited to, evaporation, sputtering, chemical vapor deposition (CVD), and metalorganic chemical vapor deposition (MOCVD).

At 350, after forming the lanthanide oxide layer, processing the device having the dielectric layer containing lanthanide oxide layer is completed. In an embodiment, completing the device includes completing the formation of a transistor. In another embodiment, completing the device includes completing the formation of a capacitor. Alternately, completing the process includes completing the construction of a memory device having an array with access transistors formed with gate dielectrics containing atomic layer deposited lanthanide oxide layer. Metallizations formed in further processing of the device may be annealed in a high-purity H$_2$ ambient at about 400° C. Such post metallization annealing provides a means to reduce interface state density in the device having a structure with a La-oxide dielectric layer contacting a ruthenium layer. Further, in another embodiment, completing the process includes the formation of an electronic system including an information handling device that uses electronic devices with transistors formed with dielectric films containing an atomic layer deposited lanthanide oxide layer. Typically, information handling devices such as computers include many memory devices, having many access transistors.

Embodiments for methods having elements similar to the embodiment of FIG. 3 may include numerous permutations for forming the lanthanide oxide layer. In an embodiment, the lanthanide oxide layer includes substantially lanthanum oxide. In another embodiment, a lanthanide oxide layer includes two or more layers of lanthanide oxides in which at least one of the layers is a La-oxide layer. The other layers may include one or more oxides of lanthanides Pr, N, Sm, Gd, Dy, Ce, Tb, Er, Eu, Lu, Tm, Ho, Pm, and Yb, with the lanthanide oxides in stoichiometric form or in non-stoichiometric form. The lanthanide layer may include stoichiometric lanthanide oxides and non-stoichiometric lanthanide oxides.

In an embodiment, a dielectric layer containing a lanthanide oxide may include dielectric layers of non-lanthanide oxides. In an embodiment, a dielectric layer contains a lanthanide oxide and a non-lanthanide oxide in which contact to a conductive layer containing ruthenium is configured with the lanthanum oxide layer contacting the conductive layer. The conductive layer may be formed substantially of ruthenium. Alternately, the conductive layer may be formed substantially of conductive ruthenium oxide.

The embodiments described herein provide a process for growing a dielectric film having a wide range of useful equivalent oxide thickness, $t_{eq}$, associated with a dielectric constant in the range from about 11 to about 30. This range of dielectric constants provides for a $t_{eq}$ ranging from about 13% to about 36% relative to a given silicon dioxide thickness. In an embodiment, a dielectric layer containing a lanthanide oxide layer has a $t_{eq}$ ranging from about 5 Å to about 20 Å. In an embodiment, a dielectric layer containing a lanthanide oxide layer has a $t_{eq}$ of less than 5 Å. Alternately, for an acceptable silicon dioxide thickness, an embodiment for a lanthanide oxide may be from less than three to less than eight larger than the acceptable silicon dioxide thickness providing enhanced probability for reducing leakage current. Further, dielectric films of lanthanide oxide layer formed by atomic layer deposition can provide not only thin $t_{eq}$ films, but also films with relatively low leakage current. Additionally, the novel process can be implemented to form transistors, capacitors, memory devices, and other electronic systems including information handling devices.

Figure 4:
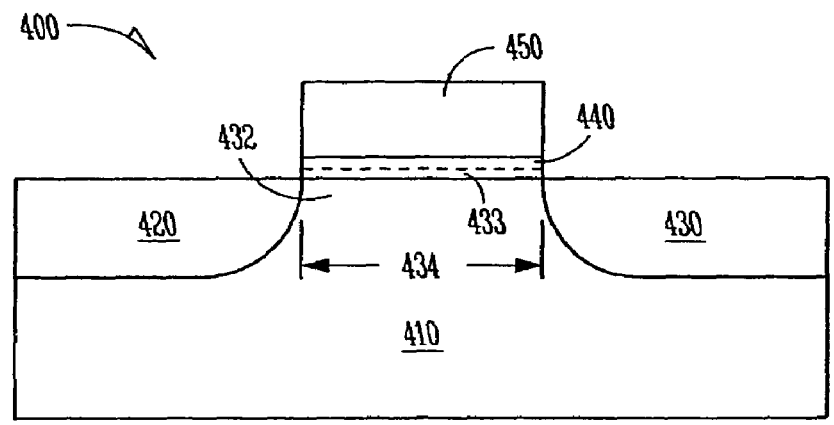
FIG. 4 shows an embodiment of a configuration of a transistor having a dielectric layer containing an atomic layer deposited lanthanide oxide layer, according to the present invention.

A transistor 400 as depicted in FIG. 4 may be constructed by forming a source region 420 and a drain region 430 in a silicon based substrate 410 where source and drain regions 420, 430 are separated by a body region 432. Body region 432 defines a channel having a channel length 434. A dielectric layer is disposed on substrate 410 formed as a layer containing lanthanide oxide on substrate 410 by atomic layer deposition. The resulting dielectric layer forms gate dielectric 440. Gate dielectric 440 may be realized as a dielectric layer formed substantially of lanthanide oxide. Gate dielectric 440 may be lanthanide oxide layer containing one or more layers of lanthanide oxides in which at least one layer is lanthanum oxide.

A gate 450 is formed over and contacts gate dielectric 440. In an embodiment, gate 450 contains ruthenium. In an embodiment, gate 450 is formed substantially of a ruthenium metal. Alternately, gate 450 is formed substantially of conductive ruthenium oxide.

An interfacial layer 433 may form between body region 432 and gate dielectric 440. In an embodiment, interfacial layer 433 may be limited to a relatively small thickness compared to gate dielectric 440, or to a thickness significantly less than gate dielectric 440 as to be effectively eliminated. Forming the substrate, and the source and drain regions may be performed using standard processes known to those skilled in the art. Additionally, the sequencing of the various elements of the process for forming a transistor may be conducted with standard fabrication processes, also as known to those skilled in the art. In an embodiment, gate dielectric 440 may be realized as a gate insulator in a silicon CMOS transistor. Use of a gate dielectric containing lanthanide oxide contacted by a conductive layer containing ruthenium is not limited to silicon based substrates, but may be used with a variety of semiconductor substrates.

Figure 5:
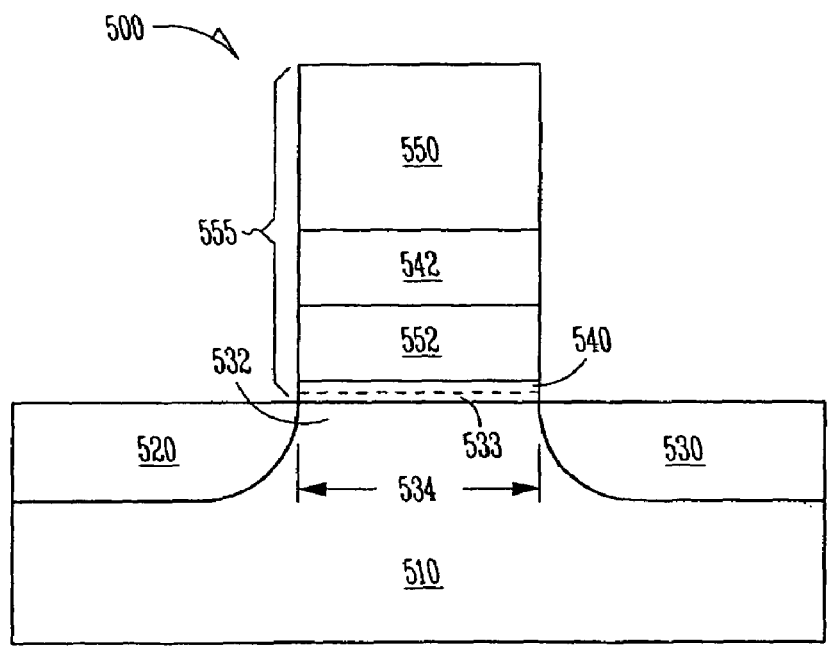
FIG. 5 shows an embodiment of a configuration of a floating gate transistor having a dielectric layer containing an atomic layer deposited lanthanide oxide layer, according to the present invention.

FIG. 5 shows an embodiment of a configuration of a transistor 500 having an atomic layer deposited lanthanide oxide layer dielectric film. Transistor 500 includes a silicon based substrate 510 with a source 520 and a drain 530 separated by a body region 532. Body region 532 between source 520 and drain 530 defines a channel region having a channel length 534. Located above body region 532 is a stack 555 including a gate dielectric 540, a floating gate 552, a floating gate dielectric 542, and a control gate 550. An interfacial layer 533 may form between body region 532 and gate dielectric 540. In an embodiment, interfacial layer 533 may be limited to a relatively small thickness compared to gate dielectric 540, or to a thickness significantly less than gate dielectric 540 as to be effectively eliminated.

Gate dielectric 540 includes a dielectric containing an atomic layer deposited lanthanide oxide layer formed in embodiments similar to those described herein. Gate dielectric 540 may be realized as a dielectric layer formed substantially of lanthanide oxide. Gate dielectric 540 may be a lanthanide oxide layer containing one or more layers of lanthanide oxides in which at least one layer is substantially lanthanum oxide. In an embodiment, floating gate 552 is formed over and contacts gate dielectric 540. Floating gate 552 contains ruthenium. In an embodiment, floating gate 552 is formed substantially of a ruthenium metal. Alternately, floating gate 552 is formed substantially of conductive ruthenium oxide.

In an embodiment, floating gate dielectric 542 includes a dielectric containing an atomic layer deposited lanthanide oxide layer formed in embodiments similar to those described herein. Floating gate dielectric 542 may be realized as a dielectric layer formed substantially of lanthanide oxide. Floating gate dielectric 542 may be lanthanide oxide layer containing one or more layers of lanthanide oxides in which at least one layer is substantially lanthanum oxide. In an embodiment, control gate 550 is formed over and contacts floating gate dielectric 542. Control gate 550 contains ruthenium. In an embodiment, control gate 550 is formed substantially of a ruthenium metal. Alternately, control gate 550 is formed substantially of conductive ruthenium oxide.

Alternately, both gate dielectric 540 and floating gate dielectric 542 may be formed as dielectric layers containing an atomic layer deposited lanthanide oxide layer. In such embodiments, control gate 550 and/or floating gate 552 may be formed containing ruthenium. In an embodiment, control gate 550 and/or floating gate 552 are formed substantially of a ruthenium metal. Alternately, control gate 550 and/or floating gate 552 are formed substantially of conductive ruthenium oxide. Floating gate 552, control gate 550, gate dielectric 540, and floating gate dielectric 542 may be realized by embodiments similar to those described herein with the remaining elements of the transistor 500 formed using processes known to those skilled in the art.

In an embodiment, gate dielectric 540 forms a tunnel gate insulator and floating gate dielectric 542 forms an inter-gate insulator in flash memory devices, where gate dielectric 540 and/or floating gate dielectric 542 include an atomic layer deposited lanthanide oxide film. Use of dielectric layers containing an atomic layer deposited lanthanide oxide layer for a gate dielectric and/or floating gate dielectric in which the dielectric layer contacts a conductive layer containing ruthenium is not limited to silicon based substrates, but may be used with a variety of semiconductor substrates.

Figure 6:
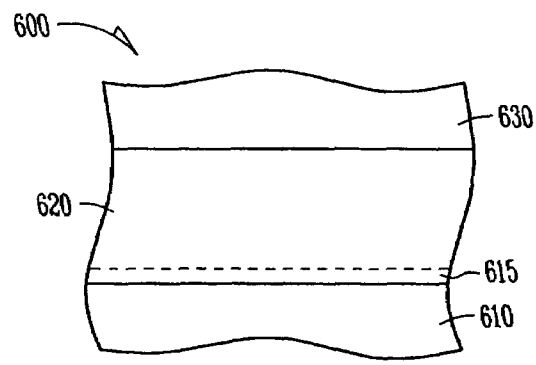
FIG. 6 shows an embodiment of a configuration of a capacitor having a dielectric layer containing an atomic layer deposited lanthanide oxide layer, according to the present invention.

The embodiments of methods for forming dielectric layers containing an atomic layer deposited lanthanide oxide layer in which the dielectric layer contacts a conductive layer containing ruthenium may also be applied to forming capacitors in various integrated circuits, memory devices, and electronic systems. In an embodiment for forming a capacitor 600 illustrated in FIG. 6, a method includes forming a first conductive layer 610, forming a dielectric layer 620 containing an atomic layer deposited lanthanide oxide layer on first conductive layer 610, and forming a second conductive layer 630 on dielectric layer 620. Dielectric layer 620 containing lanthanide oxide layer may be formed using any of the embodiments described herein. An interfacial layer 615 may form between first conductive layer 610 and dielectric layer 620. In an embodiment, interfacial layer 615 may be limited to a relatively small thickness compared to dielectric layer 620, or to a thickness significantly less than dielectric layer 620 as to be effectively eliminated.

Dielectric layer 620 may be realized as a dielectric layer formed substantially of lanthanide oxide. Dielectric layer 620 may be a lanthanide oxide layer containing one or more layers of lanthanide oxides in which at least one layer is substantially lanthanum oxide. In an embodiment, second conductive layer 630 and/or first conductive layer 610 contain ruthenium. In an embodiment, second conductive layer 630 and/or first conductive layer 610 are formed substantially of a ruthenium metal. Alternately, second conductive layer 630 and/or first conductive layer 610 are formed substantially of conductive ruthenium oxide. Embodiments for dielectric layer 620 containing an atomic layer deposited lanthanide oxide layer in a capacitor includes, but is not limited to, dielectrics in DRAM capacitors and dielectrics in capacitors in analog, radio frequency (RF), and mixed signal integrated circuits.

Various embodiments for a dielectric film containing atomic layer deposited lanthanide oxide may provide for enhanced device performance by providing devices with reduced leakage current. Such improvements in leakage current characteristics may be attained by forming one or more layers of an atomic layer deposited lanthanide oxide in a nanolaminate structure with other metal oxides including other lanthanide oxides and/or with other non-metal containing dielectrics. The transition from one layer of the nanolaminate to another layer of the nanolaminate provides further disruption to a tendency for an ordered structure in the nanolaminate stack. The term "nanolaminate" means a composite film of ultra thin layers of two or more materials in a layered stack, where the layers are alternating layers of materials of the composite film. Typically, each layer in a nanolaminate has a thickness of an order of magnitude in the nanometer range. Further, each individual material layer of the nanolaminate can have a thickness as low as a monolayer of the material or as high as 20 nanometers. In an embodiment, a La-oxide/Pr-oxide nanolaminate contains alternating layers of a lanthanum oxide and a praseodymium oxide.

Figure 7:
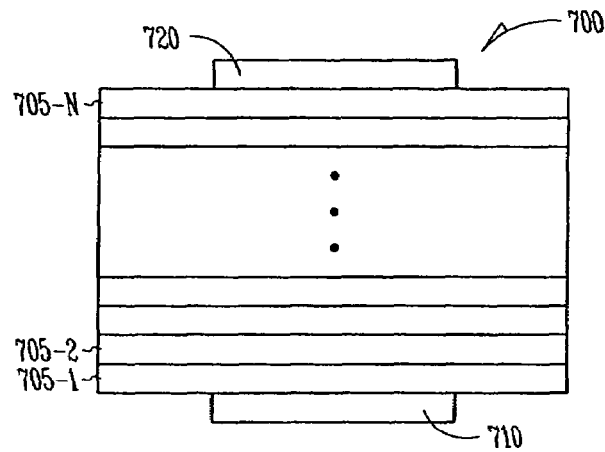
FIG. 7 depicts an embodiment of a dielectric layer including a nanolaminate having at least one layer containing an atomic layer deposited lanthanide oxide layer, according to the present invention.

FIG. 7 depicts a nanolaminate structure 700 for an embodiment of a dielectric structure including an atomic layer deposited lanthanide oxide layer dielectric film. Nanolaminate structure 700 includes a plurality of layers 705-1, 705-2 to 705-N, where at least one layer contains a lanthanide oxide layer formed by atomic layer deposition using a trisethylcyclopentadionatolanthanum precursor or a trisdipyvaloylmethanatolanthanum precursor. The other layers may be other dielectric layers or dielectric metal oxides including oxides of lanthanides Pr, Nd, Sm, Gd, Dy, Ce, Tb, Er, Eu, Lu, Tm, Ho, Pm, and/or Yb in stoichiometric form or in non-stoichiometric form. The sequencing of the layers depends on the application. The effective dielectric constant associated with nanolaminate structure 700 is that attributable to N capacitors in series, where each capacitor has a thickness defined by the thickness of the corresponding layer. By selecting each thickness and the composition of each layer, a nanolaminate structure can be engineered to have a predetermined dielectric constant.

In an embodiment, nanolaminate structure 700 contains conductive contacts 710 and 720. Conductive contacts 720 and/or 710 may be conductive layers containing ruthenium. In an embodiment, contacts 720 and/or 710 are conductive layers formed substantially of a ruthenium metal. Alternately, contacts 720 and/or 710 are conductive layers formed substantially of conductive ruthenium oxide. In an embodiment, conductive contacts 720 and/or 710 containing ruthenium contact layers 705-N and 705-1, respectively, where at least one of layers 705-1 and 705-N includes an atomic layer deposited lanthanide oxide layer. Embodiments for structures such as nanolaminate structure 700 may be used as nanolaminate dielectrics in NROM flash memory devices as well as other integrated circuits.

Transistors, capacitors, and other devices having dielectric films containing atomic layer deposited lanthanide oxide layer formed by the methods described above may be implemented into memory devices and electronic systems including information handling devices. Embodiments of these information handling devices may include wireless systems, telecommunication systems, and computers. Further, embodiments of electronic devices having dielectric films containing an atomic layer deposited lanthanide oxide layer may be realized as integrated circuits.

Figure 8:
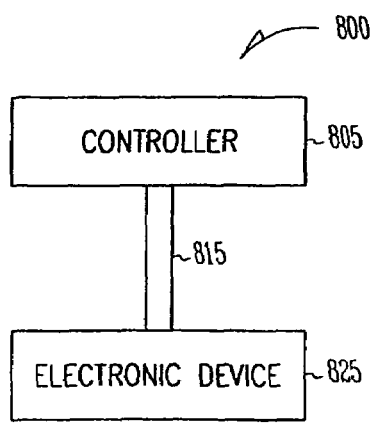
FIG. 8 is a simplified diagram for an embodiment of a controller coupled to an electronic device, according to the present invention.

FIG. 8 illustrates a diagram for an electronic system 800 having one or more devices having a dielectric layer containing an atomic layer deposited lanthanide oxide layer formed according to various embodiments of the present invention. Electronic system 800 includes a controller 805, a bus 815, and an electronic device 825, where bus 815 provides electrical conductivity between controller 805 and electronic device 825. In various embodiments, controller 805 and/or electronic device 825 include an embodiment for a dielectric layer containing an atomic layer deposited lanthanide oxide layer as previously discussed herein. Such dielectric layers may be in contact with conductive layers containing ruthenium. Electronic system 800 may include, but is not limited to, information handling devices, wireless systems, telecommunication systems, fiber optic systems, electro-optic systems, and computers.

Figure 9:
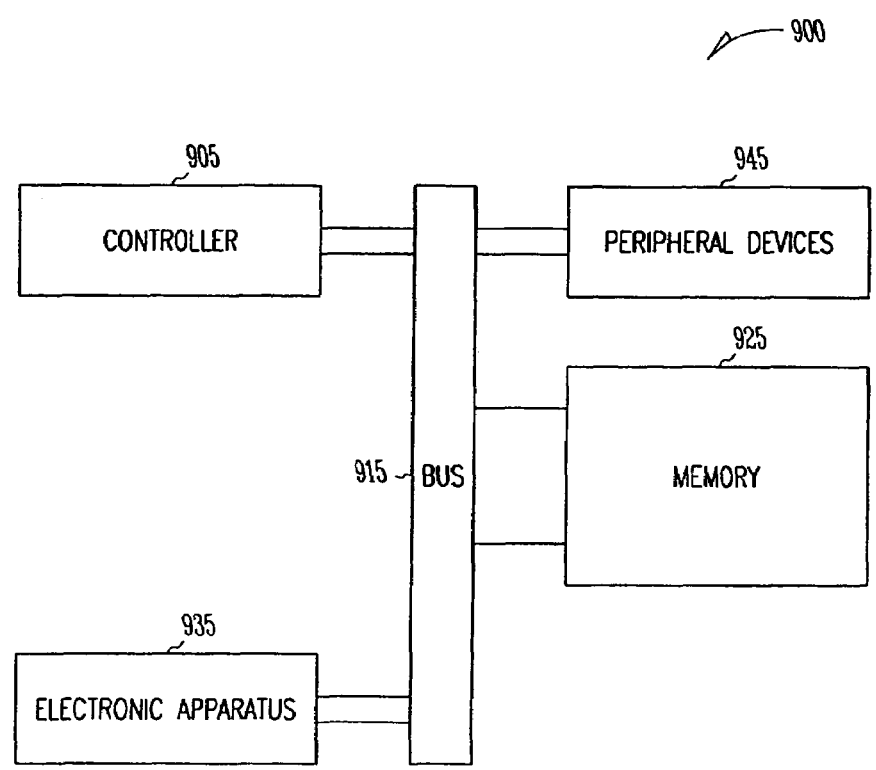
FIG. 9 illustrates a diagram for an embodiment of an electronic system having devices with a dielectric film containing an atomic layer deposited lanthanide oxide layer, according to the present invention.

FIG. 9 depicts a diagram of an embodiment of a system 900 having a controller 905 and a memory 925. Controller 905 and/or memory 925 may include a dielectric layer having an atomic layer deposited lanthanide oxide layer. Such dielectric layers may be in contact with conductive layers containing ruthenium. System 900 also includes an electronic apparatus 935, and a bus 915, where bus 915 provides electrical conductivity between controller 905 and electronic apparatus 935, and between controller 905 and memory 925. Bus 915 may include an address, a data bus, and a control bus, each independently configured. Alternately, bus 915 may use common conductive lines for providing address, data, and/or control, the use of which is regulated by controller 905. In an embodiment, electronic apparatus 935 may be additional memory configured similar as memory 925. An embodiment may include an additional peripheral device or devices 945 coupled to bus 915. In an embodiment controller 905 is a processor. Any of controller 905, memory 925, bus 915, electronic apparatus 935, and peripheral device devices 945 may include a dielectric layer having an atomic layer deposited lanthanide oxide layer. Such dielectric layers may be in contact with conductive layers containing ruthenium. System 900 may include, but is not limited to, information handling devices, telecommunication systems, and computers.

Peripheral devices 945 may include displays, additional storage memory, or other control devices that may operate in conjunction with controller 905. Alternately, peripheral devices 945 may include displays, additional storage memory, or other control devices that may operate in conjunction with controller 905 and/or memory 925.

Memory 925 may be realized as a memory device containing an atomic layer deposited lanthanide oxide layer. Such dielectric layers may be in contact with conductive layers containing ruthenium. It will be understood that embodiments are equally applicable to any size and type of memory circuit and are not intended to be limited to a particular type of memory device. Memory types include a DRAM, SRAM (Static Random Access Memory) or Flash memories. Additionally, the DRAM could be a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM), as well as Synchlink or Rambus DRAMs and other emerging DRAM technologies.

Formation of lanthanide oxide layers by an atomic layer deposition can be realized using a trisethylcyclopentadionatolanthanum precursor and/or a trisdipyvaloylmethanatolanthanum precursor. Further, lanthanide oxide films formed by atomic layer deposition processed in relatively low temperatures can be amorphous and possess smooth surfaces. Such lanthanide oxide films can provide enhanced electrical properties due to their smoother surface resulting in reduced leakage current. Additionally, such dielectric layers provide a significantly thicker physical thickness than a silicon oxide layer having the same equivalent oxide thickness, where the increased thickness would also reduce leakage current. These properties of layers containing atomic layer deposited lanthanide oxide films allow for application as dielectric layers in numerous electronic devices and systems.

Capacitors, transistors, higher level ICs or devices including memory devices, and electronic systems are constructed utilizing the novel process for forming a dielectric film having an ultra thin equivalent oxide thickness, $t_{eq}$. Gate dielectric layers or films containing atomic layer deposited lanthanide oxide are formed having a dielectric constant (k) substantially higher than that of silicon oxide, such that these dielectric films are capable of a $t_{eq}$ thinner than $SiO_2$ gate dielectrics of the same physical thickness. Alternately, the high dielectric constant relative to silicon dioxide allows the use of much larger physical thickness of these high-k dielectric materials for the same $t_{eq}$ of $SiO_2$. Forming the relatively larger thickness aids in processing gate dielectrics and other dielectric layers in electronic devices and systems.

Although specific embodiments have been illustrated and described herein, it will be appreciated by those of ordinary skill in the art that any arrangement that is calculated to achieve the same purpose may be substituted for the specific embodiments shown. This application is intended to cover any adaptations or variations of embodiments of the present invention. It is to be understood that the above description is intended to be illustrative, and not restrictive, and that the phraseology or terminology employed herein is for the purpose of description and not of limitation. Combinations of the above embodiments and other embodiments will be apparent to those of skill in the art upon studying the above description. The scope of the present invention includes any other applications in which embodiment of the above structures and fabrication methods are used. The scope of the embodiments of the present invention should be determined with reference to the appended claims, along with the full scope of equivalents to which such claims are entitled.

What is claimed is:

1. A method comprising:
   forming a dielectric layer containing a lanthanide oxide layer in an integrated circuit including:
   forming the lanthanide oxide layer by atomic layer deposition, the atomic layer deposition including pulsing at least one of a trisethylcyclopentadionatolanthanum precursor or a trisdipyvaloylmethanatolanthanum precursor; and
   pulsing hydrogen with pulsing of the at least one of a trisethylcyclopentadionatolanthanum precursor or a trisdipyvaloylmethanatolanthanum precursor.

2. The method of claim 1, wherein forming the lanthanide oxide layer includes forming a lanthanum oxide and another lanthanide oxide other than a lanthanum oxide.

3. The method of claim 1, wherein the method is a method of forming a memory device.

4. A method comprising:
   forming a dielectric layer containing a lanthanide oxide layer in an integrated circuit including forming the lanthanide oxide layer by atomic layer deposition, the atomic layer deposition including pulsing a trisethylcyclopentadionatolanthanum precursor; and
   depositing a conductive layer containing ruthenium, the conductive layer contacting the dielectric layer.

5. The method of claim 4, wherein depositing the conductive layer includes forming a layer substantially of ruthenium.

6. The method of claim 4, wherein depositing the conductive layer includes forming a layer substantially of ruthenium oxide.

7. The method of claim 4, wherein depositing the conductive layer includes depositing ruthenium by chemical vapor deposition.

8. The method of claim 4, wherein depositing the conductive layer includes depositing ruthenium by metalorganic chemical vapor deposition.

9. The method of claim 4, wherein the method further includes shaping the conductive layer by reactive ion etching in a $CHF_3+O_2$ mixture gas ambient.

10. The method of claim 4, wherein the method further includes:
    forming metallization lines to a device in the integrated circuit; and
    annealing the device in a $H_2$ ambient after forming the metallization lines.

11. The method of claim 4, wherein the method is a method of forming an integrated circuit and forming the dielectric layer includes forming the dielectric layer as a gate insulator having the conductive layer as a gate of a transistor in the integrated circuit.

12. The method of claim 4, wherein the method is a method of forming an integrated circuit and forming the dielectric layer includes forming the dielectric layer as a gate insulator in a CMOS transistor in the integrated circuit.

13. The method of claim 4, wherein the method is a method of forming an integrated circuit including forming the conductive layer as an electrode of a capacitor and forming the dielectric layer as a dielectric of the capacitor.

14. A method comprising:
    forming a memory array in a substrate including:
    forming a dielectric layer containing a lanthanide oxide layer in an integrated circuit including forming the lanthanide oxide layer by atomic layer deposition, the atomic layer deposition including pulsing a trisethylcyclopentadionatolanthanum precursor and pulsing hydrogen with pulsing of the trisethylcyclopentadionatolanthanum precursor; and
    depositing a conductive layer containing ruthenium, the conductive layer contacting the dielectric layer; and
    forming an address decoder in the substrate, the address decoder coupled to the memory array.

15. The method of claim 14, wherein depositing the conductive layer includes forming a layer substantially of ruthenium.

16. The method of claim 14, wherein depositing the conductive layer includes forming a layer substantially of ruthenium oxide.

17. The method of claim 14, wherein the method is a method of forming a memory device and forming the dielectric layer includes forming the dielectric layer as a gate insulator having the conductive layer as a gate of a transistor in the memory device.

18. The method of claim 14, wherein the method is a method of forming a flash memory device and forming the dielectric layer includes forming the dielectric layer as an inter-gate insulator having the conductive layer as a gate of a transistor in the flash memory device.

19. The method of claim 14, wherein the method is a method of forming a memory device including forming the conductive layer as an electrode of a capacitor and forming the dielectric layer as a dielectric of the capacitor in the memory device.

20. The method of claim 14, wherein the method further includes:
    forming metallization lines in the memory array; and
    annealing the device in a $H_2$ ambient after forming the metallization lines.

21. A method comprising:
forming a dielectric layer containing a lanthanide oxide layer in an integrated circuit including forming the lanthanide oxide layer by atomic layer deposition, the atomic layer deposition including pulsing a trisdipyvaloylmethanatolanthanum precursor and pulsing hydrogen with pulsing of the trisdipyvaloylmethanatolanthanum precursor; and
depositing a conductive layer containing ruthenium, the conductive layer contacting the dielectric layer.

22. The method of claim 21, wherein depositing the conductive layer includes forming a layer substantially of ruthenium.

23. The method of claim 21, wherein depositing the conductive layer includes forming a layer substantially of ruthenium oxide.

24. The method of claim 21, wherein depositing the conductive layer includes depositing ruthenium by evaporation.

25. The method of claim 21, wherein depositing a conductive layer includes depositing ruthenium by sputtering.

26. The method of claim 21, wherein the method further includes shaping the conductive layer by reactive ion etching in a $CHF_3+O_2$ mixture gas ambient.

27. The method of claim 21, wherein the method further includes:
forming metallization lines to a device in the integrated circuit configured with the dielectric layer; and
annealing the device in a $H_2$ ambient after forming the metallization lines.

28. The method of claim 21, wherein the method is a method of forming an integrated circuit and forming the dielectric layer includes forming the dielectric layer as a gate insulator having the conductive layer as a gate of a transistor in the integrated circuit.

29. The method of claim 21, wherein the method is a method of forming an integrated circuit and forming the dielectric layer includes forming the dielectric layer as a gate insulator in a CMOS transistor in the integrated circuit.

30. The method of claim 21, wherein the method is a method of forming an integrated circuit and forming the dielectric film includes forming the dielectric layer as a dielectric in a capacitor having the conductive layer as an electrode of the capacitor.

31. A method comprising:
forming a memory array in a substrate including:
forming a dielectric layer containing a lanthanide oxide layer in an integrated circuit including forming the lanthanide oxide layer by atomic layer deposition, the atomic layer deposition including pulsing a trisdipyvaloylmethanatolanthanum precursor and pulsing hydrogen with pulsing of the trisdipyvaloylmethanatolanthanum precursor; and
depositing a conductive layer containing ruthenium, the conductive layer contacting the dielectric layer; and
forming an address decoder in the substrate coupled to the memory array.

32. The method of claim 31, wherein the method is a method of forming a memory device and forming the dielectric layer includes forming the dielectric layer as a gate insulator having the conductive layer as a gate of a transistor in the memory device.

33. The method of claim 31, wherein the method is a method of forming a flash memory device and forming the dielectric layer includes forming the dielectric layer as an inter-gate insulator having the conductive layer as a gate of a transistor in the flash memory device.

34. The method of claim 31, wherein the method is a method of forming a memory device including forming the conductive layer as an electrode of a capacitor and forming the dielectric layer as a dielectric of the capacitor in the memory device.

35. The method of claim 31, wherein the method further includes:
forming metallization lines in the memory array; and
annealing the device in a $H_2$ ambient after forming the metallization lines.

36. A method comprising:
providing a controller;
coupling an integrated circuit to the controller, wherein the integrated circuit includes a dielectric layer contacting a conductive layer containing ruthenium, the dielectric containing a lanthanide oxide layer, wherein forming the dielectric layer contacting the conductive layer includes:
forming the lanthanide oxide layer by atomic layer deposition, the atomic layer deposition including pulsing a trisethylcyclopentadionatolanthanum precursor and pulsing hydrogen with pulsing of the trisethylcyclopentadionatolanthanum precursor; and
depositing the conductive layer such that the conductive layer contacts the dielectric layer.

37. The method of claim 36, wherein coupling an integrated circuit to the controller includes coupling a memory device formed as the integrated circuit.

38. The method of claim 36, wherein providing a controller includes providing a processor.

39. The method of claim 36, wherein coupling an integrated circuit to the controller includes coupling a mixed signal integrated circuit formed as the integrated circuit having the dielectric layer contacting the layer of ruthenium.

40. The method of claim 36, wherein the method is a method of forming an information handling system.

41. A method comprising:
providing a controller;
coupling an integrated circuit to the controller, wherein the integrated circuit includes a dielectric layer contacting a conductive layer containing ruthenium, the dielectric layer containing a lanthanide oxide layer, wherein forming the dielectric layer contacting the conductive layer includes:
forming the lanthanide oxide layer by atomic layer deposition, the atomic layer deposition including pulsing a trisdipyvaloylmethanatolanthanum precursor and pulsing hydrogen with pulsing of the trisdipyvaloylmethanatolanthanum precursor; and
depositing the conductive layer such that the conductive layer contacts the dielectric layer.

42. The method of claim 41, wherein coupling an integrated circuit to the controller includes coupling a memory device formed as the integrated circuit.

43. The method of claim 41, wherein providing a controller includes providing a processor.

44. The method of claim 41, wherein coupling an integrated circuit to the controller includes coupling a radio frequency integrated circuit formed as the integrated circuit having the dielectric layer contacting the conductive layer.

45. The method of claim 41, wherein the method is a method of forming an information handling system.

* * * * *

UNITED STATES PATENT AND TRADEMARK OFFICE
CERTIFICATE OF CORRECTION

PATENT NO.        : 7,081,421 B2
APPLICATION NO.   : 10/926812
DATED             : July 25, 2006
INVENTOR(S)       : Ahn et al.

It is certified that error appears in the above-identified patent and that said Letters Patent is hereby corrected as shown below:

On page 3, in field (56), under "U.S. Patent Documents", in column 2, line 31, after "Forbes" delete "et al.".

On page 5, in field (56), under "Other Publications", in column 1, line 24, delete "Halfnium" and insert -- Hafnium --, therefor.

On page 5, in field (56), under "Other Publications", in column 1, line 26, delete "Halfnium" and insert -- Hafnium --, therefor.

On page 5, in field (56), under "Other Publications", in column 1, line 26, after "Dielectric" delete "Layers".

On page 5, in field (56), under "Other Publications", in column 2, line 7, delete "Pr2)3" and insert -- $Pr_2O_3$ --, therefor.

On page 5, in field (56), under "Other Publications", in column 2, line 12, delete "Halfnium" and insert -- Hafnium --, therefor.

On page 5, in field (56), under "Other Publications", in column 2, line 14, delete "Halfnium" and insert -- Hafnium --, therefor.

On page 5, in field (56), under "Other Publications", in column 2, line 24, delete "Halfnium" and insert -- Hafnium --, therefor.

On page 5, in field (56), under "Other Publications", in column 2, line 26, delete "Halfnium" and insert -- Hafnium --, therefor.

On page 5, in field (56), under "Other Publications", in column 2, line 42, delete "Amorpohous" and insert -- Amorphous --, therefor.

On sheet 2 of 5, in FIG. 2 (Block 210), line 4, delete "TRISETHYLCYCLROPENTADIENATOLANTHANUM" and insert -- TRISETHYLCYCLOPENTADIONATOLANTHANUM --, therefor.

On sheet 2 of 5, in FIG. 3 (Block 310), line 1, delete "TRISETHYLCYCLROPENTADIENATOLANTHANUM" and insert -- TRISETHYLCYCLOPENTADIONATOLANTHANUM --, therefor.

On sheet 2 of 5, in FIG. 3 (Block 330), line 2, delete "TRISETHYLCYCLROPENTADIENATOLANTHANUM" and insert -- TRISETHYLCYCLOPENTADIONATOLANTHANUM --, therefor.

UNITED STATES PATENT AND TRADEMARK OFFICE
CERTIFICATE OF CORRECTION

PATENT NO. : 7,081,421 B2
APPLICATION NO. : 10/926812
DATED : July 25, 2006
INVENTOR(S) : Ahn et al.

It is certified that error appears in the above-identified patent and that said Letters Patent is hereby corrected as shown below:

On Sheet 2 of 5, in FIG. 3 (Block 340), line 4, delete "LATHANIDE" and insert -- LANTHANIDE--, therefor.

In column 5, line 50, delete "$7.5\mu\Omega m$," and insert -- $7.5\mu\Omega cm$, --, therefor.

In column 8, line 7, delete "tetramethl" and insert -- tetramethyl --, therefor.

In column 11, line 2, delete "as" and insert -- gas --, therefor.

In column 17, line 59, in Claim 4, after "precursor" insert -- and pulsing hydrogen with pulsing of the trisethylcyclopentadionatolanthanum precursor --.

Signed and Sealed this

Fourteenth Day of November, 2006

JON W. DUDAS
*Director of the United States Patent and Trademark Office*